(12) United States Patent
Kobayashi

(10) Patent No.: US 12,488,961 B2
(45) Date of Patent: Dec. 2, 2025

(54) IGNITION CONTROLLING METHOD, FILM FORMING METHOD, AND FILM FORMING APPARATUS

(71) Applicant: Tokyo Electron Limited, Tokyo (JP)

(72) Inventor: Takeshi Kobayashi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 575 days.

(21) Appl. No.: 17/964,641

(22) Filed: Oct. 12, 2022

(65) Prior Publication Data

US 2023/0129976 A1  Apr. 27, 2023

(30) Foreign Application Priority Data

Oct. 21, 2021  (JP) .................................. 2021-172297

(51) Int. Cl.
*H01J 37/32* (2006.01)
*C23C 16/34* (2006.01)
(Continued)

(52) U.S. Cl.
CPC ...... *H01J 37/32091* (2013.01); *C23C 16/345* (2013.01); *C23C 16/45544* (2013.01);
(Continued)

(58) Field of Classification Search
CPC ........... H01J 37/32091; H01J 37/32155; H01J 37/32183; H01J 37/32568; H01J 37/3244; H01J 2237/024; H01J 2237/24578; H01J 2237/332; H01J 2237/3387; H01J 2237/3321; C23C 16/345; C23C 16/45544; C23C 16/505; C23C 16/52; (Continued)

(56) References Cited

U.S. PATENT DOCUMENTS 9,508,547 B1 * 11/2016 Pasquale ........... C23C 16/45536
2005/0133163 A1 * 6/2005 Shannon ........... H01J 37/32082
156/345.44

(Continued)

FOREIGN PATENT DOCUMENTS

JP  2020-113743 A  7/2020
JP  2020-161722 A  10/2020

*Primary Examiner* — Eliseo Ramos Feliciano
*Assistant Examiner* — Sophia W Kao
(74) *Attorney, Agent, or Firm* — Venjuris, P.C.

(57) ABSTRACT

An ignition controlling method is performed in a film forming apparatus including: a processing container that accommodates a substrate; a plasma box formed on the processing container; a pair of electrodes arranged to sandwich the plasma box therebetween; and an RF power supply connected to the pair of electrodes via a matching box including a variable capacitor. The ignition controlling method includes: storing first information indicating a voltage between the electrodes for each of a plurality of adjustment positions of the variable capacitor, and second information indicating a voltage between the electrodes and the substrate; determining an initial position of the variable capacitor based on the first and second information; and selecting an area where a plasma ignition is to be performed from the plasma box and the processing container, by setting the adjustment positions of the variable capacitor to the initial position.

7 Claims, 12 Drawing Sheets

(51) Int. Cl.
*C23C 16/455* (2006.01)
*C23C 16/505* (2006.01)
*C23C 16/52* (2006.01)
*H01L 21/02* (2006.01)

(52) U.S. Cl.
CPC ............ *C23C 16/505* (2013.01); *C23C 16/52* (2013.01); *H01J 37/32155* (2013.01); *H01J 37/32183* (2013.01); *H01J 37/32568* (2013.01); *H01L 21/0217* (2013.01); *H01L 21/02274* (2013.01); *H01L 21/0228* (2013.01); *H01J 37/3244* (2013.01); *H01J 2237/024* (2013.01); *H01J 2237/24578* (2013.01); *H01J 2237/332* (2013.01); *H01J 2237/3387* (2013.01)

(58) Field of Classification Search
CPC ........... C23C 16/45546; H01L 21/0217; H01L 21/02274; H01L 21/0228; H01L 21/02211; H03H 7/40
See application file for complete search history.

(56) References Cited

U.S. PATENT DOCUMENTS

| | | | |
|---|---|---|---|
| 2011/0214811 A1* | 9/2011 | Ashida | C23F 1/08 333/33 |
| 2014/0367043 A1* | 12/2014 | Bishara | H01J 37/32165 315/111.21 |
| 2019/0089135 A1* | 3/2019 | Gupta | B08B 9/0328 |
| 2020/0035461 A1* | 1/2020 | Bhutta | H01L 21/31116 |
| 2020/0168439 A1* | 5/2020 | Bhutta | H01J 37/32183 |
| 2020/0312654 A1* | 10/2020 | Ito | C23C 16/45546 |
| 2021/0305018 A1* | 9/2021 | Bhutta | H03H 7/40 |
| 2022/0122812 A1* | 4/2022 | Kobayashi | H01J 37/32458 |
| 2022/0293394 A1* | 9/2022 | Kobayashi | H01J 37/32183 |

* cited by examiner

FIG. 5A

| | | \ C2 | | | | | | | | | | | | | | | | | | | |
|---|---|---|---|---|---|---|---|---|---|---|---|---|---|---|---|---|---|---|---|---|---|
| | | 0 | 5 | 10 | 15 | 20 | 25 | 30 | 35 | 40 | 45 | 50 | 55 | 60 | 65 | 70 | 75 | 80 | 85 | 90 | 95 | 100 |
| | 0 | 512 | 519 | 528 | 534 | 541 | 538 | 534 | 525 | 512 | 493 | 474 | 455 | 433 | 411 | 389 | 370 | 348 | 332 | 313 | 297 | 281 |
| | 5 | 440 | 452 | 468 | 487 | 506 | 522 | 534 | 544 | 547 | 547 | 541 | 528 | 512 | 493 | 471 | 446 | 417 | 395 | 376 | 354 | 335 |
| | 10 | 392 | 408 | 430 | 455 | 484 | 512 | 544 | 569 | 591 | 610 | 617 | 617 | 604 | 582 | 553 | 519 | 484 | 455 | 417 | 389 | 364 |
| | 15 | 354 | 367 | 395 | 430 | 465 | 506 | 553 | 601 | 651 | 693 | 721 | 730 | 712 | 677 | 626 | 569 | 515 | 468 | 427 | 389 | 354 |
| | 20 | 319 | 335 | 364 | 402 | 446 | 500 | 566 | 642 | 730 | 813 | 873 | 876 | 825 | 746 | 645 | 560 | 484 | 427 | 376 | 345 | 310 |
| | 25 | 291 | 307 | 338 | 376 | 427 | 493 | 572 | 689 | 832 | 952 | 1034 | 983 | 854 | 715 | 582 | 487 | 421 | 360 | 319 | 285 | 253 |
| | 30 | 266 | 281 | 313 | 357 | 411 | 487 | 591 | 737 | 949 | 1151 | 1183 | 996 | 778 | 610 | 490 | 405 | 342 | 294 | 262 | 234 | 212 |
| | 35 | 247 | 262 | 291 | 335 | 389 | 478 | 607 | 803 | 1126 | 1385 | 1211 | 876 | 648 | 503 | 408 | 332 | 285 | 247 | 218 | 196 | 177 |
| | 40 | 225 | 240 | 272 | 313 | 379 | 468 | 620 | 879 | 1357 | 1575 | 1066 | 715 | 528 | 408 | 332 | 278 | 237 | 209 | 187 | 168 | 149 |
| | 45 | 209 | 225 | 253 | 297 | 364 | 459 | 632 | 971 | 1667 | 1486 | 860 | 591 | 427 | 335 | 275 | 234 | 202 | 177 | 158 | 145 | 133 |
| C1 | 50 | 193 | 209 | 237 | 278 | 348 | 452 | 648 | 1100 | 1986 | 1233 | 693 | 487 | 357 | 285 | 234 | 199 | 174 | 152 | 136 | 123 | 114 |
| MP1 | 55 | 177 | 193 | 221 | 266 | 332 | 443 | 667 | 1265 | 2106 | 983 | 569 | 395 | 304 | 247 | 206 | 174 | 152 | 133 | 120 | 108 | 98 |
| | 60 | 164 | 180 | 209 | 247 | 319 | 436 | 689 | 1489 | 1799 | 791 | 484 | 335 | 259 | 212 | 180 | 152 | 133 | 117 | 108 | 98 | 89 |
| | 65 | 155 | 168 | 196 | 237 | 307 | 424 | 686 | 1629 | 1458 | 661 | 411 | 291 | 228 | 183 | 158 | 133 | 117 | 104 | 95 | 82 | 79 |
| | 70 | 145 | 158 | 183 | 225 | 294 | 405 | 737 | 2245 | 1154 | 544 | 342 | 253 | 199 | 164 | 139 | 120 | 104 | 95 | 85 | 76 | 70 |
| | 75 | 136 | 149 | 171 | 212 | 278 | 411 | 765 | 2789 | 911 | 462 | 304 | 225 | 180 | 149 | 126 | 108 | 95 | 85 | 76 | 70 | 63 |
| | 80 | 126 | 139 | 161 | 202 | 269 | 389 | 810 | 3165 | 784 | 392 | 259 | 196 | 158 | 130 | 111 | 98 | 85 | 76 | 70 | 63 | 57 |
| | 85 | 117 | 126 | 152 | 193 | 256 | 395 | 838 | 2786 | 617 | 342 | 234 | 180 | 142 | 120 | 101 | 89 | 79 | 70 | 63 | 57 | 54 |
| | 90 | 111 | 120 | 142 | 180 | 243 | 376 | 895 | 2141 | 515 | 297 | 206 | 158 | 126 | 108 | 92 | 79 | 70 | 63 | 57 | 54 | 47 |
| | 95 | 104 | 114 | 136 | 168 | 234 | 370 | 942 | 1613 | 443 | 262 | 183 | 142 | 117 | 98 | 85 | 73 | 66 | 57 | 54 | 51 | 44 |
| | 100 | 95 | 104 | 126 | 161 | 221 | 364 | 904 | 1224 | 386 | 234 | 164 | 126 | 104 | 89 | 76 | 66 | 60 | 54 | 47 | 44 | 41 |

| | | \ C2 | | | | | | | | | | | | | | | | | | | |
|---|---|---|---|---|---|---|---|---|---|---|---|---|---|---|---|---|---|---|---|---|---|
| | | 0 | 5 | 10 | 15 | 20 | 25 | 30 | 35 | 40 | 45 | 50 | 55 | 60 | 65 | 70 | 75 | 80 | 85 | 90 | 95 | 100 |
| | 0 | 417 | 414 | 408 | 395 | 383 | 364 | 345 | 323 | 297 | 272 | 247 | 221 | 196 | 171 | 149 | 130 | 111 | 92 | 76 | 63 | 51 |
| | 5 | 357 | 360 | 360 | 357 | 351 | 345 | 332 | 316 | 297 | 278 | 253 | 228 | 202 | 180 | 152 | 126 | 108 | 89 | 70 | 51 | |
| | 10 | 319 | 326 | 332 | 338 | 342 | 348 | 348 | 348 | 342 | 332 | 319 | 297 | 272 | 240 | 209 | 177 | 149 | 123 | 98 | 76 | 57 |
| | 15 | 288 | 294 | 304 | 316 | 329 | 342 | 357 | 367 | 376 | 379 | 370 | 351 | 319 | 278 | 237 | 193 | 158 | 126 | 98 | 76 | 57 |
| | 20 | 259 | 266 | 278 | 297 | 316 | 338 | 364 | 392 | 424 | 446 | 446 | 421 | 370 | 310 | 243 | 190 | 149 | 114 | 89 | 66 | 51 |
| | 25 | 237 | 243 | 259 | 278 | 304 | 332 | 370 | 421 | 481 | 519 | 528 | 474 | 383 | 297 | 221 | 168 | 130 | 98 | 76 | 57 | 41 |
| | 30 | 218 | 225 | 240 | 262 | 291 | 329 | 379 | 452 | 547 | 629 | 607 | 478 | 348 | 253 | 187 | 139 | 104 | 79 | 63 | 47 | 35 |
| | 35 | 199 | 209 | 225 | 247 | 275 | 323 | 389 | 490 | 651 | 756 | 620 | 421 | 294 | 209 | 155 | 114 | 89 | 66 | 51 | 41 | 28 |
| | 40 | 183 | 193 | 209 | 231 | 266 | 316 | 398 | 538 | 787 | 863 | 550 | 345 | 237 | 168 | 126 | 98 | 73 | 57 | 44 | 35 | 25 |
| | 45 | 171 | 177 | 196 | 221 | 256 | 310 | 408 | 595 | 961 | 813 | 446 | 285 | 193 | 139 | 104 | 82 | 63 | 47 | 38 | 28 | 22 |
| C1 | 50 | 158 | 164 | 183 | 209 | 247 | 304 | 417 | 670 | 1148 | 677 | 357 | 237 | 161 | 117 | 89 | 70 | 54 | 41 | 32 | 25 | 19 |
| MP1 | 55 | 145 | 155 | 171 | 196 | 234 | 300 | 430 | 775 | 1217 | 538 | 291 | 190 | 136 | 101 | 79 | 60 | 47 | 38 | 28 | 22 | 16 |
| | 60 | 136 | 142 | 158 | 183 | 225 | 294 | 443 | 911 | 1037 | 430 | 250 | 161 | 117 | 89 | 70 | 51 | 41 | 32 | 25 | 19 | 16 |
| | 65 | 126 | 133 | 152 | 177 | 215 | 288 | 443 | 996 | 847 | 364 | 215 | 139 | 101 | 76 | 60 | 47 | 38 | 28 | 22 | 19 | 13 |
| | 70 | 117 | 126 | 142 | 168 | 206 | 275 | 474 | 1369 | 667 | 297 | 177 | 123 | 89 | 70 | 54 | 41 | 32 | 25 | 19 | 16 | 13 |
| | 75 | 111 | 117 | 133 | 158 | 196 | 278 | 493 | 1704 | 525 | 256 | 158 | 108 | 79 | 60 | 47 | 38 | 28 | 22 | 19 | 16 | 9 |
| | 80 | 104 | 111 | 126 | 149 | 190 | 262 | 522 | 1942 | 455 | 215 | 133 | 95 | 70 | 54 | 41 | 35 | 25 | 22 | 16 | 13 | 9 |
| | 85 | 95 | 101 | 117 | 142 | 183 | 266 | 538 | 1698 | 357 | 187 | 120 | 85 | 63 | 51 | 38 | 28 | 25 | 19 | 16 | 13 | 9 |
| | 90 | 92 | 98 | 111 | 133 | 174 | 256 | 579 | 1312 | 297 | 164 | 104 | 76 | 57 | 44 | 35 | 28 | 22 | 19 | 13 | 13 | 9 |
| | 95 | 85 | 92 | 104 | 126 | 164 | 250 | 610 | 987 | 256 | 145 | 95 | 70 | 54 | 41 | 32 | 25 | 19 | 16 | 13 | 9 | 9 |
| | 100 | 79 | 85 | 98 | 117 | 158 | 247 | 582 | 746 | 225 | 126 | 85 | 63 | 47 | 38 | 28 | 22 | 19 | 16 | 13 | 9 | 6 |

|  |  | C2 | | | | | | | | | | | | | | | | | | | | |
|---|---|---|---|---|---|---|---|---|---|---|---|---|---|---|---|---|---|---|---|---|---|
|  |  | 0 | 5 | 10 | 15 | 20 | 25 | 30 | 35 | 40 | 45 | 50 | 55 | 60 | 65 | 70 | 75 | 80 | 85 | 90 | 95 | 100 |
| C1 | 0 | 553 | 560 | 569 | 576 | 572 | 566 | 553 | 534 | 512 | 490 | 465 | 440 | 414 | 395 | 367 | 345 | 326 | 307 | 288 | 275 | 256 |
|  | 5 | 493 | 512 | 538 | 566 | 591 | 607 | 620 | 620 | 610 | 595 | 569 | 538 | 506 | 468 | 436 | 405 | 373 | 351 | 329 | 307 | 288 |
|  | 10 | 452 | 474 | 512 | 560 | 607 | 658 | 696 | 727 | 730 | 718 | 683 | 629 | 576 | 522 | 474 | 430 | 389 | 357 | 329 | 304 | 278 |
|  | 15 | 417 | 446 | 490 | 550 | 623 | 708 | 797 | 863 | 885 | 844 | 762 | 674 | 591 | 515 | 446 | 395 | 351 | 316 | 288 | 262 | 237 |
|  | 20 | 383 | 411 | 465 | 541 | 648 | 784 | 933 | 1059 | 1044 | 911 | 746 | 617 | 512 | 433 | 373 | 323 | 285 | 253 | 231 | 209 | 193 |
|  | 25 | 351 | 383 | 443 | 531 | 674 | 876 | 1157 | 1297 | 1075 | 829 | 632 | 503 | 414 | 348 | 297 | 259 | 231 | 206 | 183 | 171 | 155 |
|  | 30 | 323 | 357 | 417 | 525 | 699 | 999 | 1426 | 1388 | 949 | 661 | 493 | 395 | 326 | 275 | 237 | 209 | 183 | 168 | 152 | 139 | 126 |
|  | 35 | 300 | 332 | 402 | 509 | 730 | 1145 | 1752 | 1227 | 743 | 525 | 395 | 319 | 266 | 228 | 196 | 171 | 152 | 139 | 126 | 117 | 108 |
|  | 40 | 275 | 307 | 376 | 506 | 762 | 1369 | 1844 | 1025 | 588 | 417 | 313 | 259 | 218 | 187 | 164 | 145 | 133 | 120 | 108 | 101 | 92 |
|  | 45 | 259 | 294 | 367 | 496 | 803 | 1708 | 1682 | 775 | 481 | 351 | 272 | 225 | 187 | 164 | 142 | 126 | 114 | 101 | 95 | 85 | 79 |
|  | 50 | 237 | 269 | 345 | 490 | 851 | 2176 | 1233 | 604 | 386 | 291 | 228 | 187 | 161 | 139 | 123 | 108 | 98 | 89 | 82 | 76 | 70 |
| MP1 | 55 | 221 | 253 | 326 | 481 | 901 | 2685 | 936 | 484 | 323 | 243 | 193 | 161 | 139 | 120 | 108 | 95 | 85 | 79 | 73 | 66 | 60 |
|  | 60 | 206 | 234 | 313 | 474 | 977 | 2707 | 743 | 405 | 275 | 212 | 171 | 142 | 120 | 108 | 95 | 85 | 76 | 70 | 63 | 60 | 54 |
|  | 65 | 193 | 221 | 294 | 465 | 1059 | 2144 | 607 | 345 | 237 | 183 | 152 | 126 | 108 | 95 | 82 | 76 | 66 | 60 | 57 | 54 | 47 |
|  | 70 | 180 | 209 | 278 | 452 | 1164 | 1591 | 493 | 294 | 206 | 161 | 130 | 111 | 95 | 85 | 76 | 66 | 60 | 57 | 51 | 47 | 44 |
|  | 75 | 168 | 196 | 266 | 443 | 1290 | 1199 | 421 | 256 | 180 | 142 | 117 | 101 | 85 | 76 | 66 | 60 | 54 | 51 | 47 | 44 | 41 |
|  | 80 | 155 | 183 | 253 | 436 | 1439 | 939 | 360 | 225 | 161 | 130 | 104 | 89 | 76 | 66 | 60 | 54 | 47 | 44 | 41 | 38 | 35 |
|  | 85 | 149 | 174 | 240 | 430 | 1723 | 819 | 310 | 199 | 142 | 117 | 95 | 79 | 70 | 63 | 54 | 51 | 44 | 41 | 38 | 35 | 32 |
|  | 90 | 136 | 161 | 225 | 441 | 2084 | 620 | 272 | 177 | 126 | 101 | 85 | 73 | 63 | 57 | 51 | 44 | 41 | 38 | 35 | 32 | 28 |
|  | 95 | 126 | 152 | 212 | 402 | 2609 | 528 | 240 | 158 | 117 | 92 | 76 | 66 | 57 | 51 | 44 | 41 | 38 | 35 | 32 | 28 | 28 |
|  | 100 | 117 | 139 | 202 | 389 | 3513 | 443 | 221 | 142 | 104 | 85 | 70 | 60 | 51 | 47 | 41 | 38 | 35 | 32 | 28 | 28 | 25 |

|  |  | C2 | | | | | | | | | | | | | | | | | | | | |
|---|---|---|---|---|---|---|---|---|---|---|---|---|---|---|---|---|---|---|---|---|---|---|
|  |  | 0 | 5 | 10 | 15 | 20 | 25 | 30 | 35 | 40 | 45 | 50 | 55 | 60 | 65 | 70 | 75 | 80 | 85 | 90 | 95 | 100 |
| C1 | 0 | 427 | 421 | 408 | 389 | 367 | 342 | 313 | 281 | 250 | 218 | 190 | 161 | 136 | 114 | 89 | 66 | 47 | 32 | 16 | 3 | 9 |
|  | 5 | 379 | 383 | 383 | 383 | 376 | 367 | 348 | 326 | 297 | 266 | 234 | 199 | 164 | 133 | 104 | 79 | 57 | 38 | 19 | 6 | 9 |
|  | 10 | 345 | 354 | 364 | 379 | 389 | 395 | 392 | 379 | 354 | 323 | 278 | 231 | 187 | 149 | 117 | 85 | 60 | 38 | 19 | 6 | 9 |
|  | 15 | 323 | 332 | 351 | 373 | 398 | 427 | 449 | 452 | 427 | 376 | 310 | 250 | 196 | 149 | 108 | 79 | 54 | 35 | 19 | 3 | 6 |
|  | 20 | 294 | 307 | 332 | 367 | 414 | 471 | 528 | 557 | 506 | 408 | 304 | 228 | 168 | 123 | 92 | 63 | 44 | 28 | 16 | 3 | 0 |
|  | 25 | 269 | 285 | 316 | 360 | 430 | 525 | 651 | 680 | 522 | 370 | 259 | 187 | 136 | 101 | 73 | 51 | 35 | 22 | 13 | 3 | 3 |
|  | 30 | 250 | 266 | 297 | 354 | 446 | 601 | 803 | 727 | 459 | 297 | 202 | 145 | 108 | 79 | 57 | 41 | 28 | 19 | 9 | 3 | 3 |
|  | 35 | 231 | 250 | 288 | 345 | 468 | 689 | 987 | 645 | 360 | 234 | 161 | 117 | 89 | 66 | 47 | 35 | 25 | 16 | 9 | 3 | 3 |
|  | 40 | 209 | 228 | 269 | 345 | 487 | 822 | 1037 | 541 | 288 | 187 | 123 | 95 | 70 | 54 | 41 | 28 | 22 | 13 | 6 | 0 | 3 |
|  | 45 | 199 | 218 | 262 | 338 | 512 | 1025 | 952 | 408 | 234 | 158 | 111 | 82 | 63 | 47 | 35 | 25 | 19 | 13 | 6 | 3 | 3 |
|  | 50 | 183 | 202 | 247 | 332 | 547 | 1309 | 696 | 316 | 187 | 130 | 92 | 70 | 54 | 41 | 32 | 22 | 16 | 9 | 6 | 3 | 0 |
| MP1 | 55 | 171 | 190 | 234 | 326 | 582 | 1616 | 525 | 256 | 158 | 111 | 79 | 60 | 47 | 35 | 25 | 19 | 13 | 9 | 6 | 3 | 0 |
|  | 60 | 158 | 174 | 225 | 323 | 629 | 1635 | 417 | 212 | 133 | 95 | 70 | 54 | 41 | 32 | 22 | 16 | 13 | 9 | 6 | 3 | 0 |
|  | 65 | 149 | 168 | 209 | 313 | 677 | 1290 | 342 | 180 | 117 | 82 | 63 | 47 | 35 | 28 | 22 | 16 | 9 | 6 | 3 | 0 | 0 |
|  | 70 | 139 | 155 | 199 | 307 | 743 | 958 | 278 | 155 | 101 | 73 | 54 | 41 | 32 | 25 | 19 | 13 | 9 | 6 | 3 | 0 | 0 |
|  | 75 | 130 | 145 | 190 | 300 | 825 | 721 | 237 | 136 | 89 | 63 | 47 | 38 | 28 | 22 | 16 | 13 | 9 | 6 | 3 | 0 | 0 |
|  | 80 | 120 | 136 | 180 | 294 | 923 | 566 | 202 | 117 | 79 | 57 | 44 | 35 | 25 | 19 | 16 | 13 | 9 | 6 | 3 | 0 | 0 |
|  | 85 | 114 | 130 | 174 | 291 | 1107 | 500 | 177 | 104 | 70 | 54 | 38 | 32 | 22 | 19 | 13 | 9 | 6 | 3 | 0 | 0 | 0 |
|  | 90 | 104 | 120 | 161 | 278 | 1334 | 373 | 152 | 92 | 63 | 47 | 35 | 28 | 22 | 16 | 13 | 9 | 6 | 3 | 0 | 0 | 0 |
|  | 95 | 98 | 114 | 152 | 272 | 1673 | 319 | 136 | 82 | 57 | 41 | 32 | 25 | 19 | 16 | 13 | 9 | 6 | 3 | 0 | 0 | 0 |
|  | 100 | 92 | 104 | 145 | 262 | 2252 | 266 | 123 | 73 | 51 | 38 | 28 | 22 | 19 | 13 | 9 | 9 | 6 | 3 | 0 | 0 | 0 |

|  | C2 | | | | | | | | | | | | | | | | | | | | |
|---|---|---|---|---|---|---|---|---|---|---|---|---|---|---|---|---|---|---|---|---|---|
|  |  | 0 | 5 | 10 | 15 | 20 | 25 | 30 | 35 | 40 | 45 | 50 | 55 | 60 | 65 | 70 | 75 | 80 | 85 | 90 | 95 | 100 |
| C1 | 0 | 553 | 560 | 569 | 576 | 572 | 566 | 553 | 534 | 512 | 490 | 465 | 440 | 414 | 395 | 367 | 345 | 326 | 307 | 288 | 275 | 256 |
|  | 5 | 493 | 512 | 538 | 566 | 591 | 607 | 620 | 620 | 610 | 595 | 569 | 538 | 506 | 468 | 436 | 405 | 373 | 351 | 329 | 307 | 288 |
|  | 10 | 452 | 474 | 512 | 560 | 607 | 658 | 696 | 727 | 730 | 718 | 683 | 629 | 576 | 522 | 474 | 430 | 389 | 357 | 329 | 304 | 278 |
|  | 15 | 417 | 446 | 490 | 550 | 623 | 708 | 797 | 863 | 885 | 844 | 762 | 674 | 591 | 515 | 446 | 395 | 351 | 316 | 288 | 262 | 237 |
|  | 20 | 383 | 411 | 465 | 541 | 648 | 784 | 933 | 1059 | 1044 | 911 | 746 | 617 | 512 | 433 | 373 | 323 | 285 | 253 | 231 | 209 | 193 |
|  | 25 | 351 | 383 | 443 | 531 | 674 | 876 | 1157 | 1297 | 1075 | 829 | 632 | 503 | 414 | 348 | 297 | 259 | 231 | 206 | 183 | 171 | 155 |
|  | 30 | 323 | 357 | 417 | 525 | 699 | 999 | 1426 | 1388 | 949 | 661 | 493 | 395 | 326 | 275 | 237 | 209 | 183 | 168 | 152 | 139 | 126 |
|  | 35 | 300 | 332 | 402 | 509 | 730 | 1145 | 1752 | 1227 | 743 | 525 | 395 | 319 | 266 | 228 | 196 | 171 | 152 | 139 | 126 | 117 | 108 |
|  | 40 | 275 | 307 | 376 | 506 | 762 | 1369 | 1844 | 1025 | 588 | 417 | 313 | 259 | 218 | 187 | 164 | 145 | 133 | 120 | 108 | 101 | 92 |
|  | 45 | 259 | 294 | 367 | 496 | 803 | 1708 | 1682 | 775 | 481 | 351 | 272 | 225 | 187 | 164 | 142 | 126 | 114 | 101 | 95 | 85 | 79 |
|  | 50 | 237 | 269 | 345 | 490 | 851 | 2176 | 1233 | 604 | 386 | 291 | 228 | 187 | 161 | 139 | 123 | 108 | 98 | 89 | 82 | 76 | 70 |
| MP1 | 55 | 221 | 253 | 326 | 481 | 901 | 2685 | 936 | 484 | 323 | 243 | 193 | 161 | 139 | 120 | 108 | 95 | 85 | 79 | 73 | 66 | 60 |
|  | 60 | 206 | 234 | 313 | 474 | 977 | 2707 | 743 | 405 | 275 | 212 | 171 | 142 | 120 | 108 | 95 | 85 | 76 | 70 | 63 | 60 | 54 |
|  | 65 | 193 | 221 | 294 | 465 | 1059 | 2144 | 607 | 345 | 237 | 183 | 152 | 126 | 108 | 95 | 82 | 76 | 66 | 60 | 57 | 54 | 47 |
|  | 70 | 180 | 209 | 278 | 452 | 1164 | 1591 | 493 | 294 | 206 | 161 | 130 | 111 | 95 | 85 | 76 | 66 | 60 | 57 | 51 | 47 | 44 |
|  | 75 | 168 | 196 | 266 | 443 | 1290 | 1199 | 421 | 256 | 180 | 142 | 117 | 101 | 85 | 76 | 66 | 60 | 54 | 51 | 47 | 44 | 41 |
|  | 80 | 155 | 183 | 253 | 436 | 1439 | 939 | 360 | 225 | 161 | 130 | 104 | 89 | 76 | 66 | 60 | 54 | 47 | 44 | 41 | 38 | 35 |
|  | 85 | 149 | 174 | 240 | 430 | 1723 | 819 | 310 | 199 | 142 | 117 | 95 | 79 | 70 | 63 | 54 | 51 | 44 | 41 | 38 | 35 | 32 |
|  | 90 | 136 | 161 | 225 | 441 | 2084 | 620 | 272 | 177 | 126 | 101 | 85 | 73 | 63 | 57 | 51 | 44 | 41 | 38 | 35 | 32 | 28 |
|  | 95 | 126 | 152 | 212 | 402 | 2609 | 528 | 240 | 158 | 117 | 92 | 76 | 66 | 57 | 51 | 44 | 41 | 38 | 35 | 32 | 28 | 28 |
|  | 100 | 117 | 139 | 202 | 389 | 3513 | 443 | 221 | 142 | 104 | 85 | 70 | 60 | 51 | 47 | 41 | 38 | 35 | 32 | 28 | 28 | 25 |

|  | C2 | | | | | | | | | | | | | | | | | | | | |
|---|---|---|---|---|---|---|---|---|---|---|---|---|---|---|---|---|---|---|---|---|---|
|  |  | 0 | 5 | 10 | 15 | 20 | 25 | 30 | 35 | 40 | 45 | 50 | 55 | 60 | 65 | 70 | 75 | 80 | 85 | 90 | 95 | 100 |
| C1 | 0 | 427 | 421 | 408 | 389 | 367 | 342 | 313 | 281 | 250 | 218 | 190 | 161 | 136 | 114 | 89 | 66 | 47 | 32 | 16 | 3 | 9 |
|  | 5 | 379 | 383 | 383 | 383 | 376 | 367 | 348 | 326 | 297 | 266 | 234 | 199 | 164 | 133 | 104 | 79 | 57 | 38 | 19 | 6 | 9 |
|  | 10 | 345 | 354 | 364 | 379 | 389 | 395 | 392 | 379 | 354 | 323 | 278 | 231 | 187 | 149 | 117 | 85 | 60 | 38 | 19 | 6 | 9 |
|  | 15 | 323 | 332 | 351 | 373 | 398 | 427 | 449 | 452 | 427 | 376 | 310 | 250 | 196 | 149 | 108 | 79 | 54 | 35 | 19 | 6 | 6 |
|  | 20 | 294 | 307 | 332 | 367 | 414 | 471 | 528 | 557 | 506 | 408 | 304 | 228 | 168 | 123 | 92 | 63 | 44 | 28 | 16 | 3 | 6 |
|  | 25 | 269 | 285 | 316 | 360 | 430 | 525 | 651 | 680 | 522 | 370 | 259 | 187 | 136 | 101 | 73 | 51 | 35 | 22 | 13 | 3 | 3 |
|  | 30 | 250 | 266 | 297 | 354 | 446 | 601 | 803 | 727 | 459 | 297 | 202 | 145 | 108 | 79 | 57 | 41 | 28 | 19 | 9 | 3 | 3 |
|  | 35 | 231 | 250 | 288 | 345 | 468 | 689 | 987 | 645 | 360 | 234 | 161 | 117 | 89 | 66 | 47 | 35 | 25 | 16 | 9 | 3 | 3 |
|  | 40 | 209 | 228 | 269 | 345 | 487 | 822 | 1037 | 541 | 288 | 187 | 123 | 95 | 70 | 54 | 41 | 28 | 22 | 13 | 6 | 3 | 3 |
|  | 45 | 199 | 218 | 262 | 338 | 512 | 1025 | 952 | 408 | 234 | 158 | 111 | 82 | 63 | 47 | 35 | 25 | 19 | 13 | 6 | 3 | 3 |
|  | 50 | 183 | 202 | 247 | 332 | 547 | 1309 | 696 | 316 | 187 | 130 | 92 | 70 | 54 | 41 | 32 | 22 | 16 | 9 | 6 | 3 | 0 |
| MP1 | 55 | 171 | 190 | 234 | 326 | 582 | 1616 | 525 | 256 | 158 | 111 | 79 | 60 | 47 | 35 | 25 | 19 | 13 | 9 | 6 | 3 | 0 |
|  | 60 | 158 | 174 | 225 | 323 | 629 | 1635 | 417 | 212 | 133 | 95 | 70 | 54 | 41 | 32 | 22 | 16 | 13 | 9 | 6 | 3 | 0 |
|  | 65 | 149 | 168 | 209 | 313 | 677 | 1290 | 342 | 180 | 117 | 82 | 63 | 47 | 35 | 28 | 22 | 16 | 9 | 6 | 3 | 3 | 0 |
|  | 70 | 139 | 155 | 199 | 307 | 743 | 958 | 278 | 155 | 101 | 73 | 54 | 41 | 32 | 25 | 19 | 13 | 9 | 6 | 3 | 3 | 0 |
|  | 75 | 130 | 145 | 190 | 300 | 825 | 721 | 237 | 136 | 89 | 63 | 47 | 38 | 28 | 22 | 16 | 9 | 6 | 3 | 3 | 3 | 0 |
|  | 80 | 120 | 136 | 180 | 294 | 923 | 566 | 202 | 117 | 79 | 57 | 44 | 35 | 25 | 19 | 16 | 9 | 6 | 3 | 3 | 3 | 0 |
|  | 85 | 114 | 130 | 174 | 291 | 1107 | 500 | 177 | 104 | 70 | 54 | 38 | 32 | 22 | 19 | 13 | 9 | 6 | 3 | 3 | 3 | 0 |
|  | 90 | 104 | 120 | 161 | 278 | 1334 | 373 | 152 | 92 | 63 | 47 | 35 | 28 | 22 | 16 | 9 | 6 | 3 | 3 | 3 | 3 | 0 |
|  | 95 | 98 | 114 | 152 | 272 | 1673 | 319 | 136 | 82 | 57 | 41 | 32 | 25 | 19 | 16 | 9 | 6 | 3 | 3 | 3 | 3 | 0 |
|  | 100 | 92 | 104 | 145 | 262 | 2252 | 266 | 123 | 73 | 51 | 38 | 28 | 22 | 19 | 13 | 9 | 6 | 3 | 3 | 3 | 3 | 0 |

| | | \multicolumn{21}{c|}{C2} |
|---|---|---|---|---|---|---|---|---|---|---|---|---|---|---|---|---|---|---|---|---|---|
| | | 0 | 5 | 10 | 15 | 20 | 25 | 30 | 35 | 40 | 45 | 50 | 55 | 60 | 65 | 70 | 75 | 80 | 85 | 90 | 95 | 100 |
| C1 | 0 | 512 | 519 | 528 | 534 | 541 | 538 | 534 | 525 | 512 | 493 | 474 | 455 | 433 | 411 | 389 | 370 | 348 | 332 | 313 | 297 | 281 |
| | 5 | 440 | 452 | 468 | 487 | 506 | 522 | 534 | 544 | 547 | 547 | 541 | 528 | 512 | 493 | 471 | 446 | 417 | 395 | 376 | 354 | 335 |
| | 10 | 392 | 408 | 430 | 455 | 484 | 512 | 544 | 569 | 591 | 610 | 617 | 617 | 604 | 582 | 553 | 519 | 484 | 455 | 417 | 389 | 364 |
| | 15 | 354 | 367 | 395 | 430 | 465 | 506 | 553 | 601 | 651 | 693 | 721 | 730 | 712 | 677 | 626 | 569 | 515 | 468 | 427 | 389 | 354 |
| | 20 | 319 | 335 | 364 | 402 | 446 | 500 | 566 | 642 | 730 | 813 | 873 | 876 | 825 | 746 | 645 | 560 | 484 | 427 | 376 | 345 | 310 |
| | 25 | 291 | 307 | 338 | 376 | 427 | 493 | 572 | 689 | 832 | 952 | 1034 | 983 | 854 | 715 | 582 | 487 | 421 | 360 | 319 | 285 | 253 |
| | 30 | 266 | 281 | 313 | 357 | 411 | 487 | 591 | 737 | 949 | 1151 | 1183 | 996 | 778 | 610 | 490 | 405 | 342 | 294 | 262 | 234 | 212 |
| | 35 | 247 | 262 | 291 | 335 | 389 | 478 | 607 | 803 | 1126 | 1385 | 1211 | 876 | 648 | 503 | 408 | 332 | 285 | 247 | 218 | 196 | 177 |
| | 40 | 225 | 240 | 272 | 313 | 379 | 468 | 620 | 879 | 1357 | 1575 | 1066 | 715 | 528 | 408 | 332 | 278 | 237 | 209 | 187 | 168 | 149 |
| | 45 | 209 | 225 | 253 | 297 | 364 | 459 | 632 | 971 | 1667 | 1486 | 860 | 591 | 427 | 335 | 275 | 234 | 202 | 177 | 158 | 145 | 133 |
| | 50 | 193 | 209 | 237 | 278 | 348 | 452 | 648 | 1100 | 1986 | 1233 | 693 | 487 | 357 | 285 | 234 | 199 | 174 | 152 | 136 | 123 | 114 |
| | 55 | 177 | 193 | 221 | 266 | 332 | 443 | 667 | 1265 | 2106 | 983 | 569 | 395 | 304 | 247 | 206 | 174 | 152 | 133 | 120 | 108 | 98 |
| | 60 | 164 | 180 | 209 | 247 | 319 | 436 | 689 | 1489 | 1799 | 791 | 484 | 335 | 259 | 212 | 180 | 152 | 133 | 117 | 108 | 98 | 89 |
| | 65 | 155 | 168 | 196 | 237 | 307 | 424 | 686 | 1629 | 1458 | 661 | 411 | 291 | 228 | 183 | 158 | 133 | 117 | 104 | 95 | 82 | 79 |
| | 70 | 145 | 158 | 183 | 225 | 294 | 405 | 737 | 2245 | 1154 | 544 | 342 | 253 | 199 | 164 | 139 | 120 | 104 | 95 | 85 | 76 | 70 |
| | 75 | 136 | 149 | 171 | 212 | 278 | 411 | 765 | 2789 | 911 | 462 | 304 | 225 | 180 | 149 | 126 | 108 | 95 | 85 | 76 | 70 | 63 |
| | 80 | 126 | 139 | 161 | 202 | 269 | 389 | 810 | 3165 | 784 | 392 | 259 | 196 | 158 | 130 | 111 | 98 | 85 | 76 | 70 | 63 | 57 |
| | 85 | 117 | 126 | 152 | 193 | 256 | 395 | 838 | 2786 | 617 | 342 | 234 | 180 | 142 | 120 | 101 | 89 | 79 | 70 | 63 | 57 | 54 |
| | 90 | 111 | 120 | 142 | 180 | 243 | 376 | 895 | 2141 | 515 | 297 | 206 | 158 | 126 | 108 | 92 | 79 | 70 | 63 | 57 | 54 | 47 |
| | 95 | 104 | 114 | 136 | 168 | 234 | 370 | 942 | 1613 | 443 | 262 | 183 | 142 | 117 | 98 | 85 | 73 | 66 | 57 | 54 | 51 | 44 |
| | 100 | 95 | 104 | 126 | 161 | 221 | 364 | 904 | 1224 | 386 | 234 | 164 | 126 | 104 | 89 | 76 | 66 | 60 | 54 | 47 | 44 | 41 |

| | | \multicolumn{21}{c|}{C2} |
|---|---|---|---|---|---|---|---|---|---|---|---|---|---|---|---|---|---|---|---|---|---|
| | | 0 | 5 | 10 | 15 | 20 | 25 | 30 | 35 | 40 | 45 | 50 | 55 | 60 | 65 | 70 | 75 | 80 | 85 | 90 | 95 | 100 |
| C1 | 0 | 417 | 414 | 408 | 395 | 383 | 364 | 345 | 323 | 297 | 272 | 247 | 221 | 196 | 171 | 149 | 130 | 111 | 92 | 76 | 63 | 51 |
| | 5 | 357 | 360 | 360 | 360 | 357 | 351 | 345 | 332 | 316 | 297 | 278 | 253 | 228 | 202 | 180 | 152 | 126 | 108 | 89 | 70 | 51 |
| | 10 | 319 | 326 | 332 | 338 | 342 | 348 | 348 | 348 | 342 | 332 | 319 | 297 | 272 | 240 | 209 | 177 | 149 | 123 | 98 | 76 | 57 |
| | 15 | 288 | 294 | 304 | 316 | 329 | 342 | 357 | 367 | 376 | 379 | 370 | 351 | 319 | 278 | 237 | 193 | 158 | 126 | 98 | 76 | 57 |
| | 20 | 259 | 266 | 278 | 297 | 316 | 338 | 364 | 392 | 424 | 446 | 446 | 421 | 370 | 310 | 243 | 190 | 149 | 114 | 89 | 66 | 51 |
| | 25 | 237 | 243 | 259 | 278 | 304 | 332 | 370 | 421 | 481 | 519 | 528 | 474 | 383 | 297 | 221 | 168 | 130 | 98 | 76 | 57 | 41 |
| | 30 | 218 | 225 | 240 | 262 | 291 | 329 | 379 | 452 | 547 | 629 | 607 | 478 | 348 | 253 | 187 | 139 | 104 | 79 | 63 | 47 | 35 |
| | 35 | 199 | 209 | 225 | 247 | 275 | 323 | 389 | 490 | 651 | 756 | 620 | 421 | 294 | 209 | 155 | 114 | 89 | 66 | 51 | 41 | 28 |
| | 40 | 183 | 193 | 209 | 231 | 266 | 316 | 398 | 538 | 787 | 863 | 550 | 345 | 237 | 168 | 126 | 98 | 73 | 57 | 44 | 35 | 25 |
| | 45 | 171 | 177 | 196 | 221 | 256 | 310 | 408 | 595 | 961 | 813 | 446 | 285 | 193 | 139 | 104 | 82 | 63 | 47 | 38 | 28 | 22 |
| | 50 | 158 | 164 | 183 | 209 | 247 | 304 | 417 | 670 | 1148 | 677 | 357 | 237 | 161 | 117 | 89 | 70 | 54 | 41 | 32 | 25 | 19 |
| | 55 | 145 | 155 | 171 | 196 | 234 | 300 | 430 | 775 | 1217 | 538 | 291 | 190 | 136 | 101 | 79 | 60 | 47 | 38 | 28 | 22 | 16 |
| | 60 | 136 | 142 | 158 | 183 | 225 | 294 | 443 | 911 | 1037 | 430 | 250 | 161 | 117 | 89 | 70 | 51 | 41 | 32 | 25 | 19 | 16 |
| | 65 | 126 | 133 | 152 | 177 | 215 | 288 | 443 | 996 | 847 | 364 | 215 | 139 | 101 | 76 | 60 | 47 | 38 | 28 | 22 | 19 | 13 |
| | 70 | 117 | 126 | 142 | 168 | 206 | 275 | 474 | 1369 | 667 | 297 | 177 | 123 | 89 | 70 | 54 | 41 | 32 | 25 | 19 | 16 | 13 |
| | 75 | 111 | 117 | 133 | 158 | 196 | 278 | 493 | 1704 | 525 | 256 | 158 | 108 | 79 | 60 | 47 | 38 | 28 | 22 | 19 | 16 | 9 |
| | 80 | 104 | 111 | 126 | 149 | 190 | 262 | 522 | 1942 | 455 | 215 | 133 | 95 | 70 | 54 | 41 | 35 | 25 | 22 | 16 | 13 | 9 |
| | 85 | 95 | 101 | 117 | 142 | 183 | 266 | 538 | 1698 | 357 | 187 | 120 | 85 | 63 | 51 | 38 | 32 | 25 | 19 | 16 | 13 | 9 |
| | 90 | 92 | 98 | 111 | 133 | 174 | 256 | 579 | 1312 | 297 | 164 | 104 | 76 | 57 | 44 | 35 | 28 | 22 | 19 | 13 | 13 | 9 |
| | 95 | 85 | 92 | 104 | 126 | 164 | 250 | 610 | 987 | 256 | 145 | 95 | 70 | 54 | 41 | 32 | 25 | 19 | 16 | 13 | 9 | 9 |
| | 100 | 79 | 85 | 98 | 117 | 158 | 247 | 582 | 746 | 225 | 126 | 85 | 63 | 47 | 38 | 28 | 22 | 19 | 16 | 13 | 9 | 6 |

MP1, BA, RA, MP2, Ar

IGNITION CONTROLLING METHOD, FILM FORMING METHOD, AND FILM FORMING APPARATUS

CROSS-REFERENCE TO RELATED APPLICATIONS

This application is based on and claims priority from Japanese Patent Application No. 2021-172297, filed on Oct. 21, 2021, with the Japan Patent Office, the disclosure of which is incorporated herein in its entirety by reference.

TECHNICAL FIELD

The present disclosure relates to an ignition controlling method, a film forming method, and a film forming apparatus.

BACKGROUND

Japanese Patent Laid-Open Publication Nos. 2020-161722 and 2020-113743 disclose a batch-type film forming apparatus in which a plurality of substrates is accommodated in a processing container, and a nitride film is formed on the plurality of substrates through an atomic layer deposition (ALD) method.

Japanese Patent Laid-Open Publication No. 2020-161722 proposes a film forming method which includes supplying a raw material gas containing silicon, supplying hydrogen gas activated by plasma, supplying a nitriding gas activated by heat to nitride a silicon element, supplying a nitriding gas activated by plasma to nitride the silicon element, and supplying a purge gas between each step. As a result, a silicon nitride film may be formed while achieving a desired film thickness distribution.

Japanese Patent Laid-Open Publication No. 2020-113743 proposes a film forming method which includes supplying a raw material gas containing silicon, supplying a modifying gas that contains hydrogen gas activated by plasma, supplying a nitriding gas activated by heat to nitride a silicon element, and supplying a purge gas between each step. As a result, a damage to a base film on which the silicon nitride film is formed may be reduced.

SUMMARY

According to an aspect of the present disclosure, an ignition controlling method is performed in a film forming apparatus including: a processing container that accommodates a substrate; a plasma box formed on the processing container; a pair of electrodes arranged to sandwich the plasma box therebetween; and an RF power supply connected to the pair of electrodes via a matching box including a variable capacitor. The ignition controlling method includes: storing, in a storage in advance, first information indicating a voltage between the electrodes for each of a plurality of adjustment positions of the variable capacitor when a radio-frequency voltage with a first frequency is applied to the pair of electrodes from the RF power supply, and second information indicating a voltage between the electrodes and the substrate for each of the plurality of adjustment positions of the variable capacitor when the radio-frequency voltage with the first frequency is applied between the electrodes and the substrate from the RF power supply; determining an initial position of the variable capacitor based on the first and second information, by referring to the storage; and selecting an area where a plasma ignition is to be performed from the plasma box and the processing container, by setting the adjustment positions of the variable capacitor to the initial position.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 5A and 5B are examples of tables representing the electrode-to-electrode voltage and the electrode-to-wafer voltage at each of adjustment positions of variable capacitors when RF of 13.56 MHz is applied.

FIGS. 6A and 6B are examples of tables representing the electrode-to-electrode voltage and the electrode-to-wafer voltage at each of the adjustment positions of the variable capacitors when RF of 14.56 MHz is applied.

FIGS. 7A and 7B are views illustrating initial positions of the variable capacitors.

FIGS. 8A and 8B are views illustrating the initial positions of the variable capacitors.

DETAILED DESCRIPTION

Figure 1:
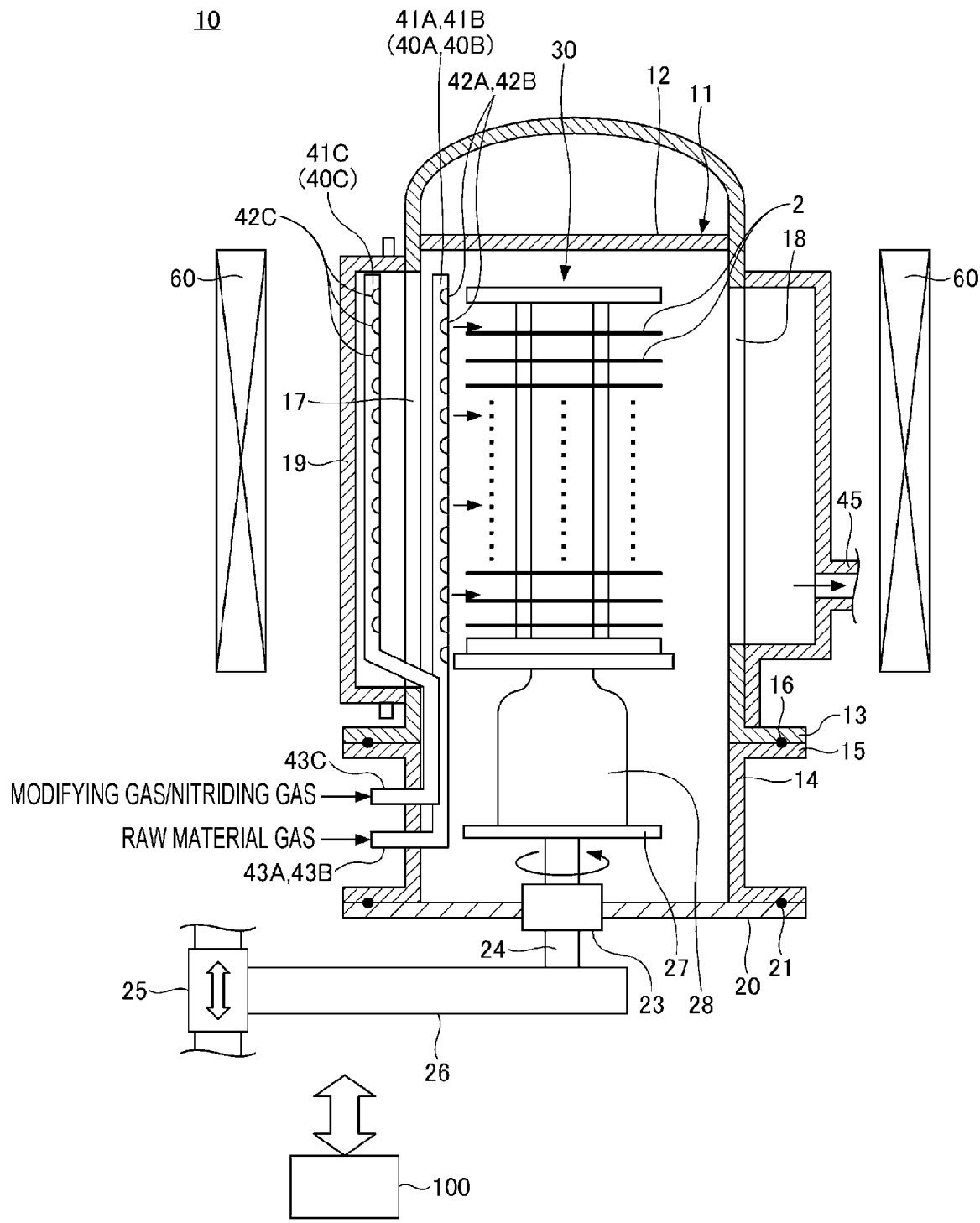
FIG. 1 is a structural view of a film forming apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components may be denoted by the same reference numerals, and overlapping descriptions thereof may be omitted.

[Film Forming Apparatus]

First, a film forming apparatus 10 according to an embodiment of the present disclosure will be described with reference to FIG. 1. FIG. 1 is a view illustrating the film forming apparatus 10 according to the embodiment. The film forming apparatus 10 accommodates a plurality of wafers in a processing container 11, and forms a nitride film on the plurality of wafers through an atomic layer deposition (ALD) method. The film forming apparatus 10 is an example of an apparatus that executes such a film forming method.

The film forming apparatus 10 is a batch-type vertical heat treatment apparatus that processes the plurality of wafers. However, the film forming apparatus 10 is not limited to such a heat treatment apparatus. For example, the film forming apparatus 10 may be a single-wafer type apparatus that processes wafers one by one. Further, the film forming apparatus 10 may be a semi-batch type apparatus. The semi-batch type apparatus may be an apparatus in which a plurality of wafers arranged around a rotation center line of a rotary table is rotated together with the rotary table, to sequentially pass through a plurality of regions to which different gases are supplied.

The nitride film is, for example, a silicon nitride film (SiN), but is not limited thereto. The silicon nitride film formed by the film forming method executed by the film forming apparatus 10 according to the present embodiment is formed on the wafers in the manner that a raw material gas (e.g., dichlorosilane gas) and plasma of a nitriding gas (e.g., ammonia ($NH_3$) gas) are alternately supplied to the wafers.

In this film forming method, the film thickness of the nitride film formed within the plane of each wafer tends to become thick at the edge of the wafer. While a method is used which supplies plasma of nitrogen ($N_2$) gas before supplying plasma of ammonia gas in order to suppress the film thickness at the edge of the wafer, this method requires the additional step of adjusting the film thickness. Thus, the film forming method according to the present embodiment provides a technique capable of further improving the controllability of the film thickness and the film quality.

The film forming apparatus 10 includes a processing container 11 that accommodates the wafers 2 and forms therein a space in which the wafers 2 are processed, a lid 20 that airtightly closes an opening of the lower end of the processing container 11, and a substrate holder 30 that holds the wafers 2. The wafers 2 are, for example, semiconductor substrates, and more particularly are, for example, silicon wafers. The substrate holder 30 is also called a wafer boat.

The processing container 11 includes a cylindrical processing container main body 12 opened at the lower end thereof, and having a ceiling. The processing container main body 12 is made of, for example, quartz. A flange 13 is formed at the lower end of the processing container main body 12. The processing container 11 also includes, for example, a cylindrical manifold 14. The manifold 14 is made of, for example, stainless steel. A flange 15 is formed at the upper end of the manifold 14, and the flange 13 of the processing container main body 12 is provided on the flange 15. A sealing member 16 such as an O-ring is disposed between the flange 15 and the flange 13.

The lid 20 is airtightly attached to the opening of the lower end of the manifold 14 via a sealing member 21 such as an O-ring. The lid 20 is made of, for example, stainless steel. A through hole is formed in the center of the lid 20 to penetrate the lid 20 in the vertical direction. A rotary shaft 24 is disposed in the through hole. A magnetic fluid seal 23 seals the gap between the lid 20 and the rotary shaft 24. The lower end of the rotary shaft 24 is rotatably supported by an arm 26 of a lifting mechanism 25. A rotary plate 27 is provided on the upper end of the rotary shaft 24. The substrate holder 30 is provided on the rotary plate 27 via a heat insulating base 28.

The substrate holder 30 holds the plurality of wafers 2 at intervals in the vertical direction. Each of the plurality of wafers 2 is horizontally held. The substrate holder 30 is made of, for example, quartz ($SiO_2$) or silicon carbide (SiC). When the lifting mechanism 25 is moved up, the lid 20 and the substrate holder 30 move up, and the substrate holder 30 is carried into the processing container 11, so that the opening of the lower end of the processing container 11 is sealed with the lid 20. When the lifting mechanism 25 is moved down, the lid 20 and the substrate holder 30 move down, and the substrate holder 30 is carried out from the processing container 11. When the rotary shaft 24 is rotated, the substrate holder 30 rotates together with the rotary plate 27.

The film forming apparatus 10 includes three gas supply pipes 40A, 40B, and 40C. The gas supply pipes 40A, 40B, and 40C are made of, for example, quartz ($SiO_2$) The gas supply pipes 40A, 40B, and 40C supply a gas into the processing container 11. The type of gas will be described later. One gas supply pipe may eject one type of gas or various types of gas in sequence. Further, a plurality of gas supply pipes may eject the same type of gas.

The gas supply pipes 40A, 40B, and 40C include horizontal pipes 43A, 43B, and 43C that horizontally penetrate the manifold 14, and vertical pipes 41A, 41B, and 41C that are arranged vertically inside the processing container 11. The vertical pipes 41A, 41B, and 41C include a plurality of gas supply ports 42A, 42B, and 42C arranged at intervals in the vertical direction. A gas supplied to the horizontal pipes 43A, 43B, and 43C is sent to the vertical pipes 41A, 41B, and 41C, and ejected horizontally from the plurality of gas supply ports 42A, 42B, and 42C. The vertical pipe 41C is disposed inside a plasma box 19. The vertical pipes 41A and 41B are arranged inside the processing container 11.

The film forming apparatus 10 includes an exhaust pipe 45. The exhaust pipe 45 is connected to an exhaust device (not illustrated). The exhaust device includes a vacuum pump to exhaust the inside of the processing container 11. An exhaust port 18 is formed in the processing container main body 12 to exhaust the inside of the processing container 11. The exhaust port 18 is disposed to face the gas supply ports 42A, 42B, and 42C. The gas horizontally ejected from the gas supply ports 42A, 42B, and 42C passes through the exhaust pipe 18, and then, is exhausted from the exhaust pipe 45. The exhaust device sucks the gas inside the processing container 11, and sends the gas to a detoxifying apparatus. The detoxifying apparatus removes harmful components of the exhausted gas, and then, discharges the exhausted gas into the atmosphere.

The film forming apparatus 10 further includes a heater 60. The heater 60 is disposed outside the processing container 11, and heats the inside of the processing container 11 from the outside of the processing container 11. For example, the heater 60 is formed in a cylindrical shape to surround the processing container main body 12. The heater 60 is configured with, for example, an electric heater. The heater 60 heats the inside of the processing container 11, thereby improving the capability of processing the gas supplied into the processing container 11.

[Plasma Box]

Figure 2:
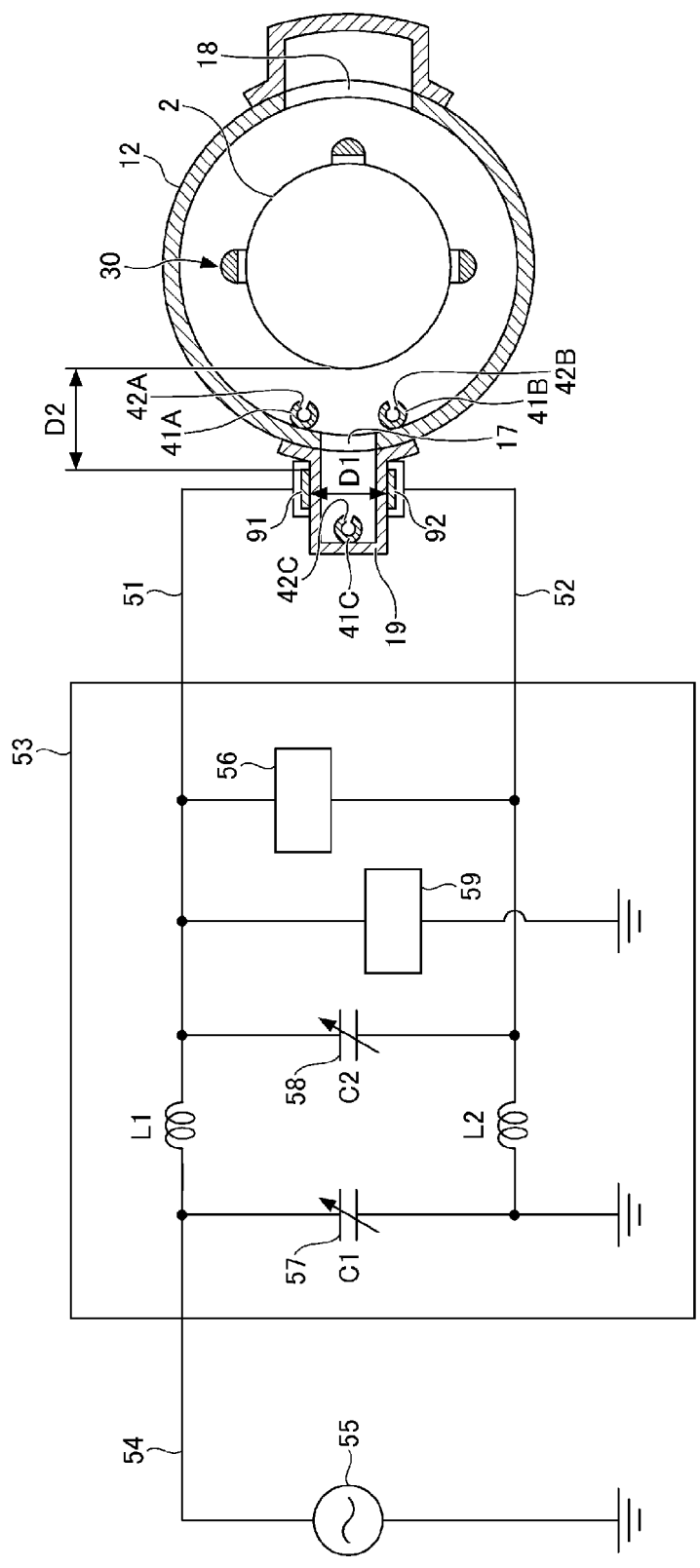
FIG. 2 is a view illustrating an electrode-to-electrode voltage and an electrode-to-wafer voltage according to the embodiment.

FIG. 2 is a view illustrating an electrode-to-electrode voltage and an electrode-to-wafer voltage of the film forming apparatus 10 according to the embodiment. As illustrated in FIGS. 1 and 2, an opening 17 is formed in a portion of the processing container main body 12 in the circumferential direction. The plasma box 19 is formed on the side surface of the processing container 11 to surround the opening 17. The plasma box 19 is formed to protrude radially outward from the processing container main body 12, and formed, for example, in a U shape when viewed in the vertical direction.

A pair of electrodes (electrode pair) 91 and 92 is arranged to sandwich the plasma box 19 therebetween. The electrode pair 91 and 92 is a pair of parallel electrodes provided to face the external side of the plasma box 19. The electrode pair 91 and 92 is vertically elongated, similar to the vertical pipe 41C, while facing each other. The electrode pair 91 and 92 is connected to an RF power supply 55 via a matching box 53, and a radio-frequency voltage from the RF power supply 55 is applied to the electrode pair.

The matching box 53 is connected in series between the RF power supply 55 and the electrode pair 91 and 92 via voltage supply lines 51, 52, and 54. The matching box 53 includes a first variable capacitor 57 (C1), a second variable capacitor 58 (C2), and coils (fixed inductances) L1 and L2. The control unit 100 illustrated in FIG. 1 obtains variation amounts of the first and second variable capacitors 57 and 58 through the ignition controlling method to be described later, and changes mechanical adjustment positions (also simply referred to as adjustment positions) of the first and second variable capacitors 57 and 58 according to the variation amounts. The change of the mechanical adjustment positions refers to controlling the rotation of motors (not illustrated) of the respective first and second variable capacitors 57 and 58. Accordingly, the capacitances C1 and C2 of the first second variable capacitors 57 and 58 are individually adjusted. Thus, the matching box 53 adjusts its own impedance to perform a matching between an output impedance and a load impedance of the RF power supply 55. A sensor 56 is provided in the matching box 53 to measure a voltage applied between the electrode pair 91 and 92 (a voltage across a distance D1 in FIG. 2; hereinafter, also referred to as an "electrode-to-electrode voltage"). A sensor 59 measures a voltage applied between the electrode pair 91 and the ground. Assuming that each wafer has a ground potential, the voltage measured by the sensor 59 is regarded as a voltage applied between the end of the electrode 91 that faces the processing container 11 and the end of the wafer (a voltage across a distance D2 in FIG. 2; hereinafter, also referred to as an "electrode-to-wafer voltage").

[Gas Supply]

The plasma box 19 accommodates the vertical pipe 41C for the modifying gas and the nitriding gas. The modifying gas is ejected horizontally toward the opening 17 from the gas supply ports 42C of the vertical pipe 41C, and supplied into the processing container main body 12 through the opening 17. Similarly, the nitriding gas is ejected horizontally toward the opening 17 from the gas supply ports 42C of the vertical pipe 41C, and supplied into the processing container main body 12 through the opening 17.

The vertical pipes 41A and 41B for the raw material gas are disposed outside the plasma box 19, and arranged outside the opening 17 inside the processing container main body 12. The vertical pipe 41B may be provided for the nitriding gas inside the plasma box 19, so as to supply the nitriding gas separately from the vertical pipe 41C for the modifying gas.

When a radio-frequency voltage is applied between the electrode pair 91 and 92, a radio-frequency electric field is applied into the internal space of the plasma box 19. The modifying gas is converted into plasma by the radio-frequency electric field in the inner space of the plasma box 19. When the modifying gas contains nitrogen gas, the nitrogen gas is converted into plasma so that nitrogen radicals are generated. When the modifying gas contains hydrogen gas, the hydrogen gas is converted into plasma so that hydrogen radicals are formed. When the modifying gas contains ammonia gas, the ammonia gas is converted into plasma so that ammonia radicals are formed. These active species are supplied into the processing container main body 12 through the opening 17, to modify a Si-containing layer.

The modification of the Si-containing layer includes, for example, removing a halogen element contained in the Si-containing layer. By removing the halogen element, dangling bonds of Si may be formed. As a result, the Si-containing layer may be activated, and the nitriding of the Si-containing layer may be accelerated. In the present embodiment, the nitriding of the Si-containing layer is performed after the modification of the Si-containing layer.

Figure 3:
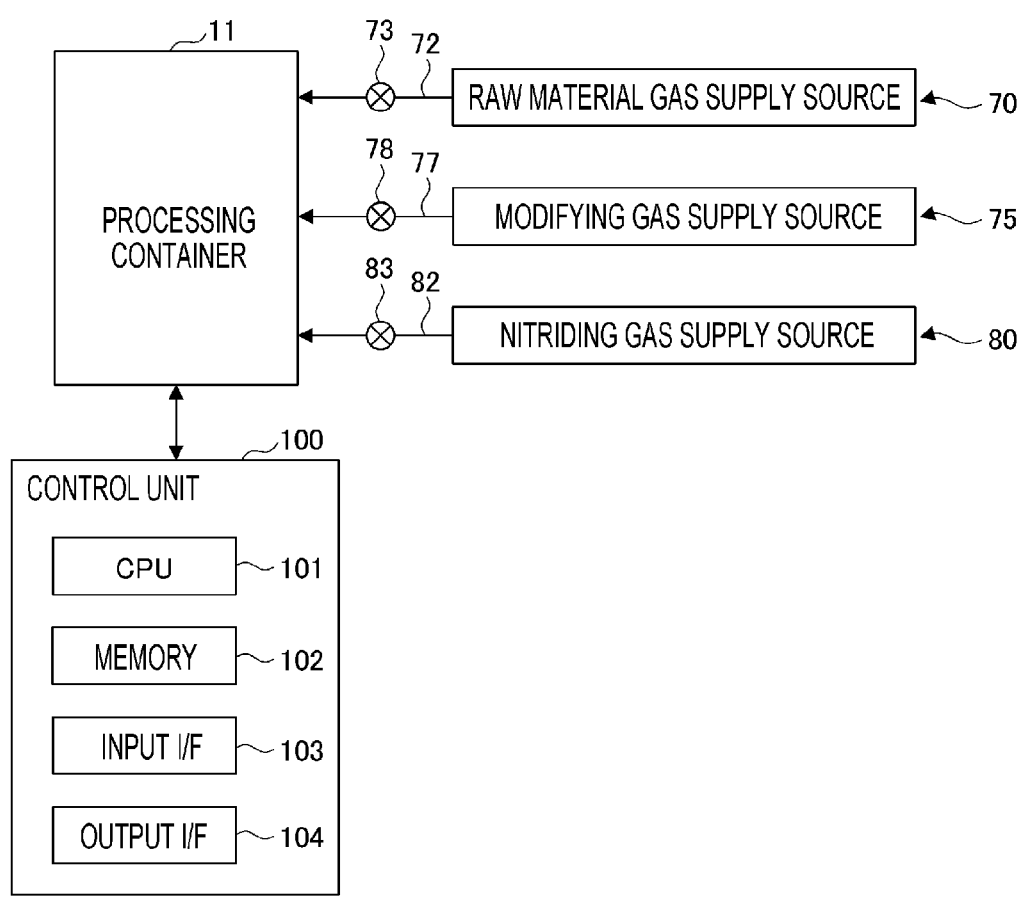
FIG. 3 is a view illustrating a gas supply source and a control unit of the film forming apparatus according to the embodiment.

FIG. 3 is a view illustrating the gas supply and the control unit of the film forming apparatus 10 according to the embodiment. In the film forming apparatus 10, the gas supply includes a raw material gas supply source 70, a modifying gas supply source 75, and a nitriding gas supply source 80. The raw material gas supply source 70 supplies the raw material gas into the processing container 11. The raw material gas contains an element (e.g., silicon) to be nitrided.

As for the raw material gas, for example, dichlorosilane (DCS: $SiH_2Cl_2$) gas is used. While the raw material gas in the present embodiment is the DCS gas, the technology of the present disclosure is not limited thereto. As for a raw material gas other than the DCS gas, for example, monochlorosilane (MCS: $SiH_3Cl$) gas, trichlorosilane (TCS: $SiHCl_3$) gas, silicon tetrachloride (STC: $SiCl_4$) gas, and hexachlorodisilane (HCDS: $Si_2Cl_6$) gas may be used. By supplying these gases to the wafers 2, a layer containing silicon (Si) (the Si-containing layer) may be formed on the wafers 2. Since the raw material gas contains a halogen element, the Si-containing layer contains the halogen element, in addition to Si.

A raw material gas pipe 72 connects the raw material gas supply source 70 and the gas supply pipes 40A and 40B, and sends the raw material gas from the raw material gas supply source 70 to the gas supply pipes 40A and 40B. The raw material gas is ejected horizontally toward the wafers 2 from the gas supply ports 42A and 42B of the vertical pipes 41A and 41B. A raw material gas flow rate control valve 73 is provided in the middle of the raw material gas pipe 72, to control the flow rate of the raw material gas.

The modifying gas supply source 75 supplies the modifying gas into the processing container 11 to modify the Si-containing layer. The modification of the Si-containing layer includes, for example, removing the halogen element contained in the Si-containing layer. By removing the halogen element, dangling bonds of Si may be formed. As a result, the Si-containing layer may be activated, and the nitriding of the Si-containing layer may be accelerated. As for the modifying gas, nitrogen gas, hydrogen gas, ammonia gas, or a gas containing any one of the gases may be used.

A modifying gas pipe 77 connects the modifying gas supply source 75 and the gas supply pipe 40C, and sends the modifying gas from the modifying gas supply source 75 to the gas supply pipe 40C. The modifying gas is ejected horizontally toward the wafers 2 from the gas supply ports 42C of the vertical pipe 41C. A modifying gas flow rate control valve 78 is provided in the middle of the modifying gas pipe 77, to control the flow rate of the modifying gas.

The nitriding gas supply source 80 supplies the nitriding gas into the processing container 11 to nitride the Si-containing layer. As for the nitriding gas, for example, ammonia ($NH_3$) gas, organic hydrazine compound gas, amine-based gas, NO gas, $N_2O$ gas, or $NO_2$ gas is used. As for the organic hydrazine compound gas, for example, hydrazine ($N_2H_4$) gas, diazene ($N_2H_2$) gas, or monomethylhydrazine (MMH) gas is used. As for the amine-based gas, for example, monomethylamine gas is used.

A nitriding gas pipe 82 connects the nitriding gas supply source 80 and the gas supply pipe 40C, and sends the nitriding gas from the nitriding gas supply source 80 to the gas supply pipe 40C. The nitriding gas is ejected horizontally toward the wafers 2 from the gas supply ports 42C of the vertical pipe 41C. A nitriding gas flow rate control valve 83 is provided in the middle of the nitriding gas pipe 82, to control the flow rate of the nitriding gas.

A purge gas supply source (not illustrated) may be provided. By supplying a purge gas into the processing container 11, the raw material gas, the modifying gas, and the nitriding gas that remain inside the processing container 11 are removed. As for the purge gas, for example, an inert gas is used. As for the inert gas, a noble gas such as Ar gas, or $N_2$ gas is used.

As illustrated in FIG. 3, the film forming apparatus 10 includes the control unit 100 that controls the film forming apparatus 10. The control unit 100 is configured with, for example, a computer, and includes a central processing unit (CPU) 101 and a memory 102. The memory 102 stores programs for controlling various processes executed in the film forming apparatus 10. The control unit 100 causes the CPU 101 to execute the programs stored in the memory 102 so as to control the operation of the film forming apparatus 10. The control unit 100 further includes an input interface 103 and an output interface 104. The control unit 100 receives a signal from the outside through the input interface 103, and transmits a signal to the outside through the output interface 104.

The programs may be stored in a computer-readable storage medium, and installed in the memory 102 of the control unit 100 from the storage medium. Examples of the computer-readable storage medium include a hard disk (HD), a flexible disk (FD), a compact disk (CD), a magnet optical disk (MO), and a memory card. Further, the programs may be downloaded from a server through the Internet, and installed in the memory 102 of the control unit 100.

[Paschen Curve]

Figure 4:
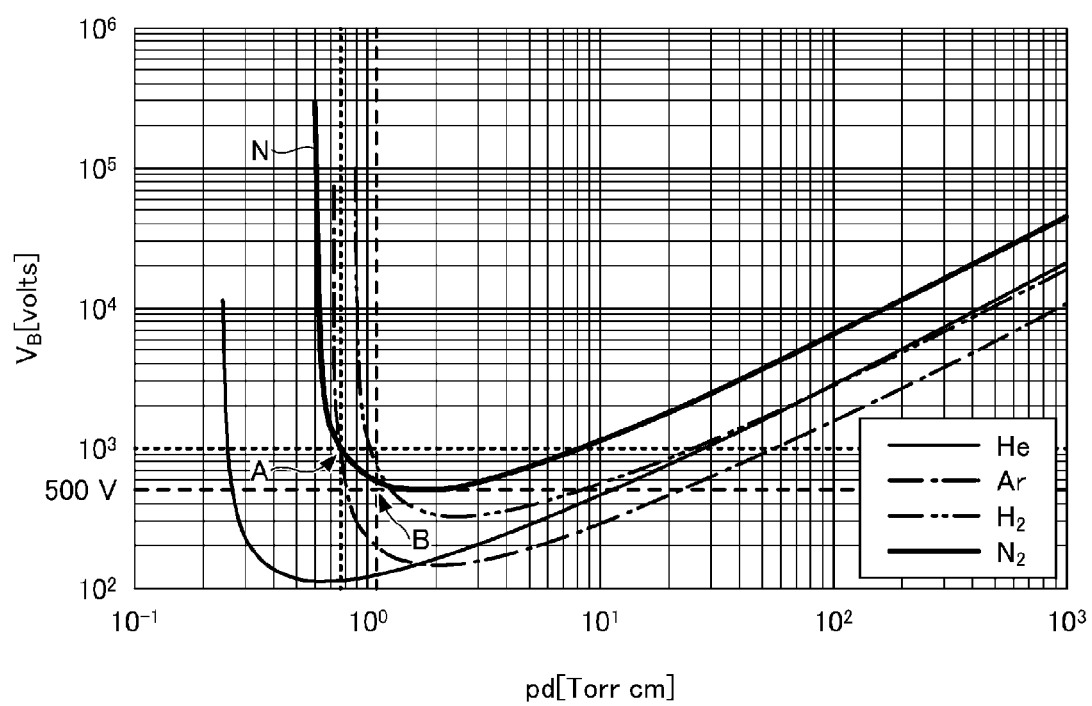
FIG. 4 is a view illustrating a Paschen curve.

FIG. 4 is a view illustrating a Paschen curve. The horizontal axis indicates a multiplication value pd of a pressure "p" in the processing container 11 and an electrode-to-electrode distance "d," and the vertical axis indicates a discharge voltage $V_B$. As illustrated in FIG. 2, the distance between the electrodes 91 and 92 is D1, and the distance between the electrode and the wafer is D2, in which D1<D2. Thus, the multiplication value pd of the horizontal axis satisfies a relationship pD1<pD2.

It is assumed that nitrogen ($N_2$) gas is supplied into the plasma box 19 and the processing chamber 11. The discharge voltage $V_B$ of an intersection A between the Paschen curve N of the $N_2$ gas and the dashed line representing pD1 is 1,000 V. That is, in the plasma box 19 having the nitrogen gas atmosphere, a voltage equal to or higher than the discharge start voltage according to the Paschen curve N, i.e., the voltage of 1,000 V or more is applied between the electrodes 91 and 92, to cause a plasma ignition thereby generating plasma in the plasma box 19. That is, it may be understood that in the plasma box 19, the lowest ignition voltage between the electrodes 91 and 92 is 1,000 V, and a plasma ignition does not occur in the plasma box 19 when a voltage lower than 1,000 V is applied between the electrodes 91 and 92.

Meanwhile, the discharge voltage $V_B$ of an intersection B between the Paschen curve N of the $N_2$ gas and the dashed line representing pD2 is 500 V. That is, in the processing container 11 having the nitrogen gas atmosphere, a voltage equal to or higher than the discharge start voltage according to the Paschen curve N, i.e., the voltage of 500 V or higher is applied between the electrode 91 and the wafer, to cause a plasma ignition thereby generating plasma in the processing container 11. That is, it may be understood that in the processing container 11, the lowest ignition voltage between the electrode 91 and the wafer is 500 V, and a plasma ignition does not occur in the processing container 11 when a voltage lower than 500 V is applied between the electrode 91 and the wafer.

In prior art, since the active gas generated in the plasma box 19 (e.g., plasma of the nitrogen gas) is remotely supplied into the processing container 11, the film thickness increases on the side of the wafers 2 relatively closer to the edge thereof in the processing container 11, or the film quality is deteriorated. Meanwhile, the ignition controlling method according to the present embodiment provides a method that enables to select generating plasma in the processing container 11 and generating plasma in the plasma box 19. As a result, it is possible to control the film thickness and the film quality on the edge and the center of the wafers 2.

The selection of the plasma ignition in the plasma box 19 and the plasma ignition in the processing chamber 11 may be implemented by controlling the "electrode-to-electrode voltage" or the "electrode-to-wafer voltage" with respect to the discharge voltage obtained from the Paschen curve.

In order to control the "electrode-to-electrode voltage" and the "electrode-to-wafer voltage" at the time of ignition with respect to the discharge voltage obtained from the Paschen curve, mechanical adjustment positions (hereinafter, referred to as "adjustment positions") of the first and second variable capacitors 57 and 58 in the matching box 53 are controlled. Accordingly, the capacitances C1 and C2 of the first and second variable capacitors 57 and 58 are adjusted. In addition to the adjustment of the capacitances C1 and C2, the frequency of the RF power supply 55 may be variably controlled. In this case, a frequency variable RF power supply may be used for the RF power supply 55.

[Tables]

The "electrode-to-electrode voltage" and the "electrode-to-wafer voltage" are measured at each adjustment position of the first and second variable capacitors 57 and 58, for each frequency of the radio frequency supplied by the RF power supply 55, based on matching positions at the time of plasma generation, and tables storing the measured values are generated. The generated tables are stored in advance in the memory 102. By referring to the tables stored in the memory 102, it is possible to determine the adjustment positions of the first and second variable capacitors 57 and 58 where a reflected wave at the time of ignition is suppressed, and the adjustment positions thereof for selecting the plasma ignition in the plasma box 19 or the processing container 11. By setting initial positions of the first and second variable capacitors 57 and 58 to the adjustment positions for selecting the plasma ignition in the plasma box 19 or the processing container 11, the area where the plasma ignition is to be performed may be selected from the plasma box 19 and the processing container 11.

FIGS. 5A and 5B are examples of tables storing measured values obtained by measuring the electrode-to-electrode voltage (FIG. 5A) and the electrode-to-wafer voltage (FIG. 5B) at each adjustment position of the first and second variable capacitors 57 and 58 when a radio-frequency voltage with a frequency of 13.56 MHz is applied. FIGS. 6A and 6B are examples of tables storing measured values obtained by measuring the electrode-to-electrode voltage (FIG. 6A) and the electrode-to-wafer voltage (FIG. 6B) at each adjustment position of the first and second variable capacitors 57 and 58 when a radio-frequency voltage with a frequency of 14.56 MHz is applied.

The measured values stored in the table of FIG. 5A are an example of first information representing the electrode-to-electrode voltage for each of the plurality of adjustment positions of the variable capacitors when the radio-frequency voltage with the frequency of 13.56 MHz which is an example of a second frequency is applied to the electrode pair 91 and 92 from the RF power supply 55.

The measured values stored in the table of FIG. 5B are an example of second information representing the electrode-to-wafer voltage for each of the plurality of adjustment positions of the variable capacitors when the radio-frequency voltage with the frequency of 13.56 MHz is applied between the electrode and the wafer from the RF power supply 55. At this time, it is regarded that the wafer has a ground potential.

The measured values stored in the table of FIG. 6A are an example of third information representing the electrode-to-electrode voltage for each of the plurality of adjustment positions of the variable capacitors when the radio-frequency voltage with the frequency of 14.56 MHz which is an example of a first frequency is applied to the electrode pair 91 and 92 from the RF power supply 55.

The measured values stored in the table of FIG. 6B are an example of fourth information representing the electrode-to-wafer voltage for each of the plurality of adjustment positions of the variable capacitors when the radio-frequency voltage with the frequency of 14.56 MHz is applied between the electrode and the wafer from the RF power supply 55. The first to fourth information are stored in advance in the memory 102. The memory 102 is an example of a storage unit that stores the first to fourth information. While the present example represents the first to fourth information in table forms, the information may not be stored in the table forms.

In all of FIGS. 5A, 5B, 6A, and 6B, nitrogen gas is supplied from the gas supply ports 42A, 42B, and 42C of the vertical pipes 41A, 41B, and 41C when the measured values stored in the tables are obtained. However, the nitrogen gas may be supplied from at least one of the gas supply ports 42A, 42B, and 42C of the vertical pipes 41A, 41B, and 41C.

The table of FIG. 5A represents the measured values of the electrode-to-electrode voltage when the radio-frequency voltage with the frequency of 13.56 MHz and a power of 100 W is applied between the electrodes 91 and 92 from the RF power supply 55, and the table of FIG. 5B represents the measured values of the electrode-to-wafer voltage. The adjustment positions of the first and second variable capacitors 57 and 58 shift in units of 5% within a range of the minimum position 0% to the maximum position 100%, and accordingly, the capacitances C1 and C2 of the first and second variable capacitors 57 and 58 are changed for each adjustment position. The table of FIG. 5A stores the measured values of the electrode-to-electrode voltage, and the table of FIG. 5B stores the measured values of the electrode-to-wafer voltage, when the capacitances C1 and C2 are changed in units of 5%. The conditions for generating the tables of FIGS. 6A and 6B are the same as those for generating the tables of FIGS. 5A and 5B, except that the frequency of the radio frequency output from the RF power supply 55 is changed to 14.56 MHz. While the capacitances C1 and C2 in FIGS. 5A, 5B, 6A, and 6B are changed in units of 5%, the unit value may be changed without being limited thereto, for example, the capacitances C1 and C2 may be changed in units of 1%.

No plasma ignition occurs in the plasma box 19 and the processing container 11 when any of the tables of FIGS. 5A, 5B, 6A, and 6B is generated. That is, the electrode-to-electrode voltage and the electrode-to-wafer voltage are measured in a state where no plasma discharge occurs in the plasma box 19 and the processing container 11. In this way, the relatively low radio-frequency voltage and pressure at which no plasma is generated are used when measuring the electrode-to-electrode voltage and the electrode-to-wafer voltage, so that the voltage measurement may be stably performed.

Further, the memory 102 stores information of a matching position MP1 when plasma stably matches between the electrodes, and information of a matching position MP2 when plasma stably matches between the electrode and the wafer.

In the tables of FIGS. 5A and 5B, the position where C1 is 60% and C2 is 25% is the matching position MP1 when the plasma ignition (discharge) occurs and plasma stably matches between the electrodes. In the tables of FIGS. 5A and 5B, the position where C1 is 80% and C2 is 30% is the matching position MP2 when the plasma ignition (discharge) occurs and plasma stably matches between the electrode and the wafer.

The tables of FIGS. 6A and 6B also indicate the matching position MP1 between the electrodes and the matching position MP2 between the electrode and the wafer, at the same positions as those in the tables of FIGS. 5A and 5B. From the tables of FIGS. 5A, 5B, 6A, and 6B, it may be understood that when the frequency of the radio frequency is increased, the relatively high voltage area where both the electrode-to-electrode voltage and the electrode-to-wafer voltage are 1,000 V or more moves from the center to the left.

FIGS. 7A and 7B are views illustrating the determination of the initial positions of the first and second variable capacitors 57 and 58 when the radio-frequency voltage with the frequency of 14.56 MHz is applied, referring to the tables of FIGS. 6A and 6B. FIGS. 8A and 8B are views illustrating the determination of the initial positions of the first and second variable capacitors 57 and 58 when the frequency of the radio frequency is changed from 14.56 MHz to 13.56 MHz, referring to the tables of FIGS. 5A and 5B.

For each of the frequencies of 14.56 MHz and 13.56 MHz, tables are generated by measuring the voltages at each of the adjustment positions of the first and second variable capacitors 57 and 58 (FIGS. 5A, 5B, 6A, and 6B). Accordingly, for each frequency, the control positions (adjustment positions) where the reflected wave is suppressed at the time of plasma ignition in each of the plasma box 19 and the processing container 11, centering on the matching positions MP1 and MP2, may be determined to be the initial positions of the first and second variable capacitors 57 and 58.

For example, when the radio-frequency voltage with the frequency of 14.56 MHz is applied, an area Ar relatively close to the matching positions MP1 and MP2 is specified as the area where the reflected wave is relatively small, referring to the tables of FIGS. 6A and 6B. FIGS. 7A and 7B illustrate the specified results. Then, it is performed to specify an area where a stable discharge occurs in the plasma box 19 within the area Ar, that is, an area BA of the adjustment positions of the variable capacitors where the plasma ignition occurs between the electrodes in a state where the reflected wave is not substantially generated. Since the electrode-to-electrode voltage in the area of FIG. 7A is 1,000 V or more, the plasma ignition is possible between the electrodes. When the plasma ignition occurs between the electrodes so that the stable discharge is performed, the electrode-to-wafer voltage does not matter.

In this way, when the radio-frequency voltage with the frequency of 14.56 MHz is applied, the initial positions of the first and second variable capacitors 57 and 58 are determined such that the capacitances C1 and C2 become any in the area BA, referring to FIG. 7A. Accordingly, when the radio frequency with the frequency of 14.56 MHz is applied, the initial positions of the adjustment positions of the first and second variable capacitors 57 and 58 are controlled such that the capacitances C1 and C2 fall within the area BA of FIG. 7A. As a result, the plasma ignition may be performed within the plasma box 19.

Next, when the frequency of the radio frequency is changed from 14.56 MHz to 13.56 MHz, the area Ar relatively close to the matching positions MP1 and MP2 is specified, referring to the tables of FIGS. 5A and 5B. FIGS. 8A and 8B illustrate the specified results. While the frequency of the radio frequency may be changed from 14.56 MHz to 13.56 MHz in an instant (about several milliseconds), the first and second variable capacitors 57 and 58 may not follow the frequency and hardly move at this time. In this state, it is performed to specify an area where the stable discharge is performed in the processing chamber 11 within the area Ar, that is, an area RA of the adjustment positions of the variable capacitors where the plasma ignition occurs between the electrode and the wafer in a state where the reflected wave is not substantially generated. In FIG. 8B, since there exists a position where the electrode-to-wafer voltage is 500 V or more within the area RA, the plasma ignition is possible between the electrode and the wafer. When the plasma ignition occurs between the electrode and the wafer so that the stable discharge is performed, the electrode-to-electrode voltage is set to be less than the minimum ignition voltage of 1,000 V.

Thus, referring to the table of FIG. 8A, the electrode-to-electrode voltage within the area RA of FIG. 8A is less than 1,000 V. Accordingly, when the radio frequency with the frequency of 13.56 MHz is applied, the initial positions of the adjustment positions of the first and second variable capacitors 57 and 58 are controlled such that the capacitances C1 and C2 become the position where the electrode-to-wafer voltage is 500 V or more within the area RA of FIG. 8B. As a result, the plasma ignition may be performed in the processing container 11.

Further, by controlling the initial positions of the adjustment positions of the first and second variable capacitors 57 and 58 while switching the frequency of the radio frequency of the RF power supply 55 between 13.56 MHz and 14.56 MHz, the area where the plasma ignition is to be performed may be switched quickly.

As described above, when the frequency of the radio frequency of the RF power supply 55 is set to the first frequency (e.g., 14.56 MHz), and the initial positions of the first and second variable capacitors 57 and 58 are determined, it is possible to use the electrode-to-electrode voltage (first information) and the electrode-to-wafer voltage (second information) in the tables obtained when the radio-frequency voltage of the frequency is applied. It is preferable to use the information of the first matching position MP1 and the second matching position MP2, in addition to the first and second information.

When the frequency of the radio frequency of the RF power supply 55 is set to the second frequency (e.g., 13.56 MHz) different from the first frequency, and the initial positions of the first and second variable capacitors 57 and 58 are determined, it is possible to use the electrode-to-electrode voltage (third information) and the electrode-to-wafer voltage (fourth information) in the tables obtained when the radio-frequency voltage of each frequency is applied. It is preferable to use the information of the first matching position MP1 and the second matching position MP2, in addition to the third and fourth information.

[Ignition Controlling Method]

Figure 9:
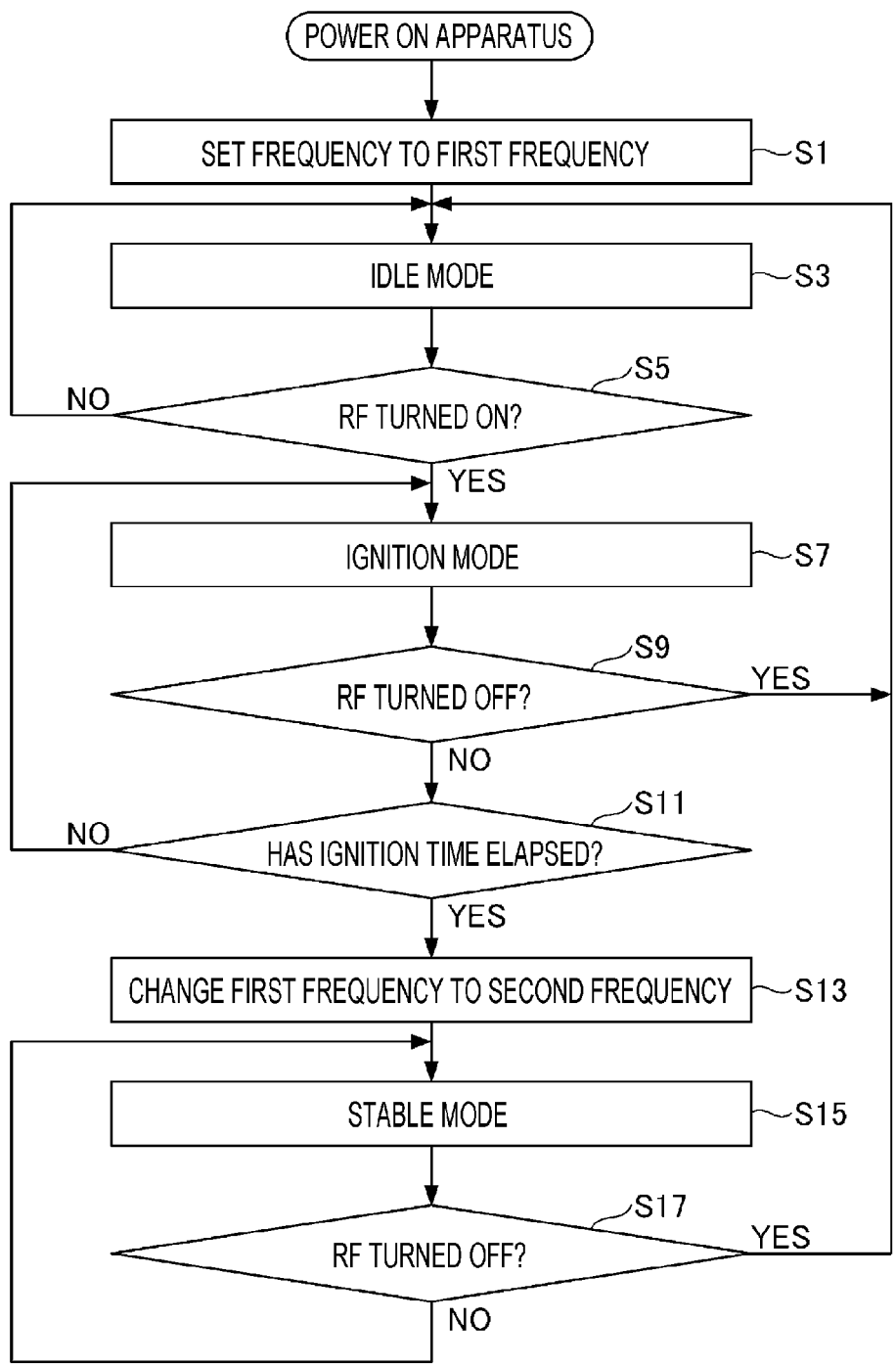
FIG. 9 is a flowchart illustrating an ignition controlling method according to an embodiment.
Figure 10A:
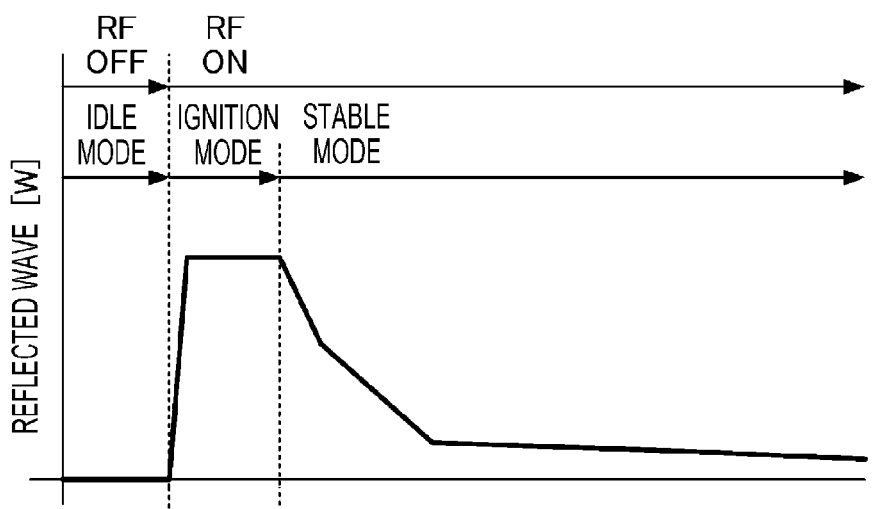
FIGS. 10A and 10B are a time chart illustrating the ignition controlling method according to the embodiment.
Figure 10B:
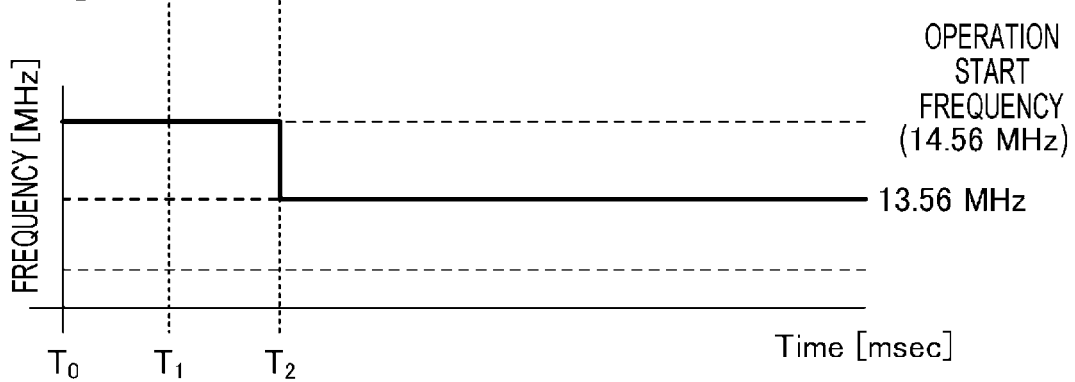

Next, descriptions will be made on an ignition controlling method that uses the initial positions of the first and second variable capacitors 57 and 58 determined as described above, with reference to FIGS. 9, 10A, and 10B. FIG. 9 is a flowchart illustrating an ignition control method according to an embodiment. FIGS. 10A and 10B are a time chart illustrating the ignition controlling method according to the embodiment. The control unit 100 controls the ignition controlling method according to the embodiment.

In the present example, as illustrated in FIG. 10B, the RF power supply 55 is turned OFF from a timing $T_0$ to a timing $T_1$, and turned ON at the timing $T_1$ to apply the radio-frequency voltage with the frequency of 14.56 MHz. Then, at a timing $T_2$, the frequency is changed from 14.56 MHz to 13.56 MHz, and the radio-frequency voltage with the frequency of 13.56 MHz is applied from the RF power supply 55.

The process of FIG. 9 is started when the film forming apparatus 10 is powered ON. The frequency of the radio frequency output from the RF power supply 55 is set in advance to the first frequency (step S1). In the present example, the first frequency is 14.56 MHz. In an idle mode, the radio-frequency voltage enters an OFF state (step S3), and in this state, the control unit 100 supplies nitrogen gas from the plurality of gas supply ports 42A, 42B, and 42C of the vertical pipes 41A, 41B, and 41C.

The control unit 100 determines whether the RF power supply 55 has been turned ON so that the radio-frequency voltage has been applied between the electrodes 91 and 92 (step S5). The idle mode continues until the radio-frequency voltage is applied between the electrodes 91 and 92, and when the RF power supply 55 is turned ON at the timing $T_1$ so that the radio-frequency voltage is applied between the electrodes 91 and 92, an ignition mode starts (step S7). In the ignition mode, the control unit 100 controls the adjustment positions of the first and second variable capacitors 57 and 58 to determined initial positions. The control unit 100 selects the determined initial positions from either the positions where the ignition is possible in the plasma box 19 or the positions where the ignition is possible in the processing container 11, and controls the initial positions of the first and second variable capacitors 57 and 58. By controlling the initial positions of the variable capacitors in this manner, the area where the plasma ignition is to be performed may be selected from the plasma box 19 or the processing container 11.

Next, the control unit 100 determines whether the RF power supply 55 has been turned OFF (step S9). When it is determined that the RF power supply 55 has been turned OFF, the process returns to step S3 and shifts to the idle mode.

When it is determined that the RF power supply 55 has not been turned OFF, it is determined whether an ignition time (predetermined time from the ignition mode) has elapsed (step S11). At the timing $T_2$ when the ignition time has elapsed from the timing $T_1$, the frequency of the radio frequency output from the RF power supply 55 is changed to the second frequency (step S13). In the present example, the second frequency is 13.56 MHz. The ignition time from the timing $T_1$ to the timing $T_2$ is, for example, 1.0 ms to 400 ms. As illustrated in FIG. 10A, the reflected wave of the radio frequency increases during the ignition time from the timing $T_1$ to the timing $T_2$. Thereafter, when the frequency of the radio frequency is changed to 13.56 MHz, a stable mode starts (step S15).

Next, the control unit 100 determines whether the RF power supply 55 has been turned OFF (step S17). The stable mode is maintained during the ON of the RF power supply 55 (step S15), and when the RF power supply 55 is turned OFF, the process returns to step S3 and shifts to the idle mode.

According to the ignition controlling method described above, the area where the plasma ignition is to be performed may be selected from the plasma box 19 and the processing container 11. Thus, the controllability of the film thickness of the film on the wafers 2 may be improved. For example, the film thickness distribution of the silicon nitride film formed on the wafers 2 may be controlled, such as making the film thickness of the film on the wafers 2 into a bowl shape having the thin center, rather than a mountain shape having the thick center. For example, by causing the plasma ignition in the plasma box 19, the film thickness of the film close to the edge of the wafers 2 may be increased, and by causing the plasma ignition in the processing container 11, the film thickness of the film close to the center of the wafers 2 may be increased or the entire film thickness may be increased. Further, by selecting the area where the plasma ignition is to be performed from the plasma box 19 and the processing container 11, the film quality such as the stress of the film on the wafers 2 may be controlled.

In the descriptions above, both the frequency of the radio frequency output from the RF power supply 55 and the capacitances of the variable capacitors are changed. However, while changing only the capacitances of the variable capacitors without changing the frequency of the radio frequency, the area where the plasma ignition is to be performed may be selected from the plasma box 19 and the processing container 11. As a result, it is also possible to improve the controllability of the film thickness and the film quality of the film formed on the wafers.

[Film Forming Method]

Figure 11:
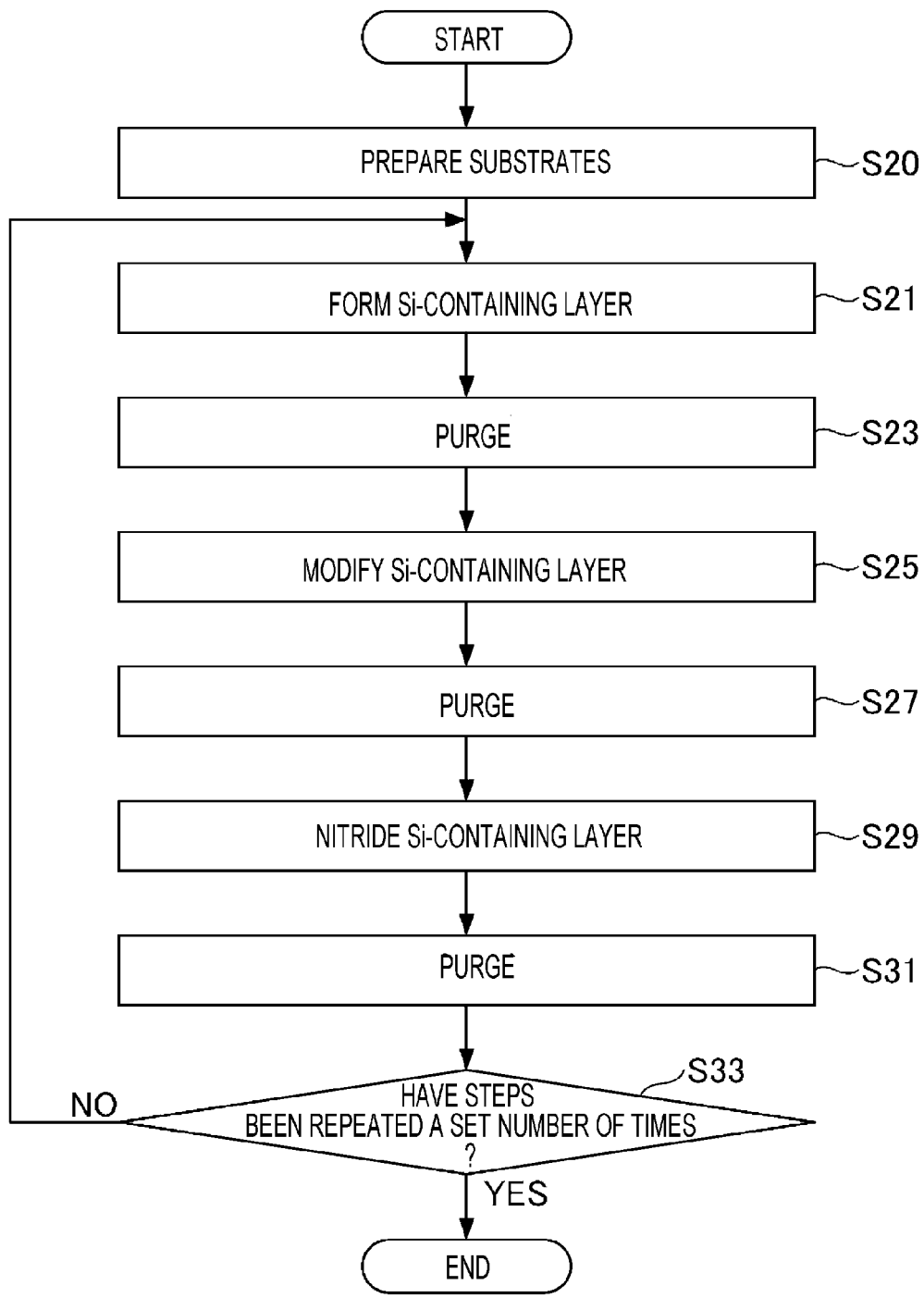
FIG. 11 is a flowchart illustrating a film forming method according to an embodiment.
Figure 12:
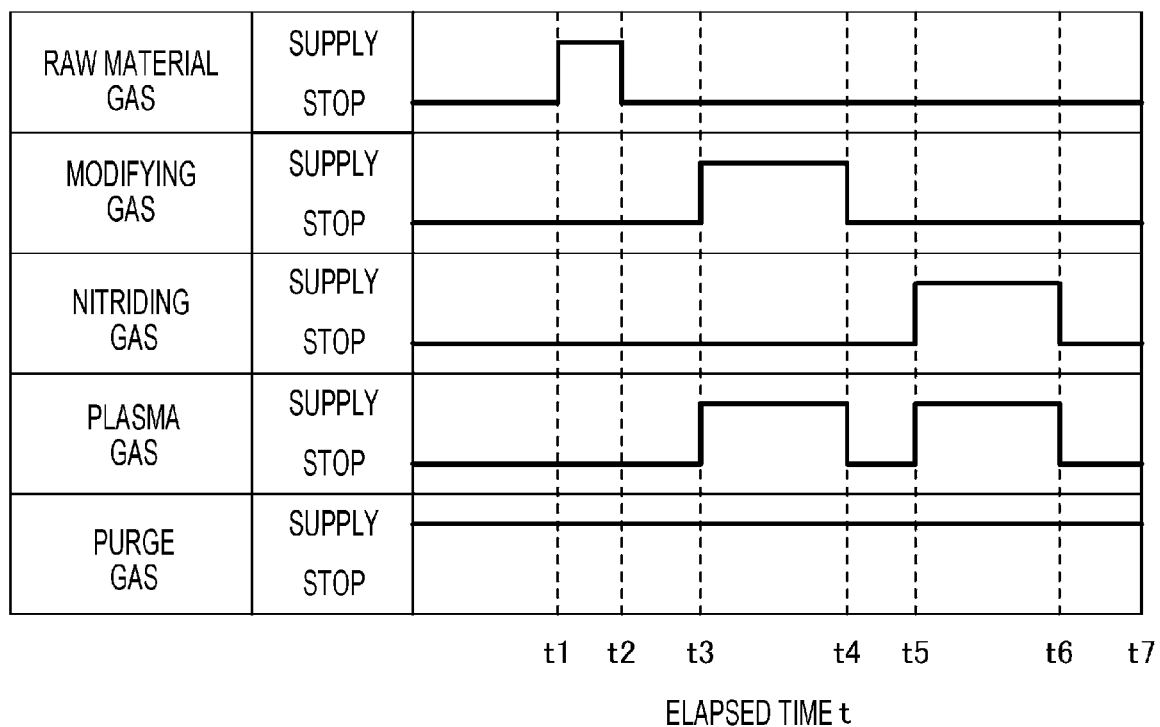
FIG. 12 is a time chart illustrating the film forming method according to the embodiment.

Next, a film forming method according to an embodiment will be described with reference to FIGS. 11 and 12. FIG. 11 is a flowchart illustrating a film forming method according to an embodiment. FIG. 12 is a time chart illustrating the film forming method according to the embodiment. The control unit 100 controls the film forming method according to the embodiment.

When the film forming method is started, the control unit 100 prepares the wafers 2 by carrying the wafers 2 into the processing container 11 (step S20). In step S20, first, a transfer device loads the plurality of wafers 2 on the substrate holder 30 outside the processing container 11. The substrate holder 30 horizontally holds the plurality of wafers 2 at intervals in the vertical direction. Next, the lifting mechanism 25 is moved up to move up the lid 20 and the substrate holder 30. The wafers 2 are carried into the processing container 11 together with the substrate holder 30, and the opening of the lower end of the processing container 11 is sealed with the lid 20.

Next, the control unit 100 forms a Si-containing layer (step S21). Step S21 is performed from a timing t1 to a timing t2 illustrated in FIG. 12. In step S21, a raw material gas is supplied from the raw material gas supply source 70 into the processing chamber 11 while exhausting the inside of the processing chamber 11 by the exhaust device connected to the exhaust pipe 45. The raw material gas is, for example, the DCS gas. As a result, the Si-containing layer is formed on the wafers 2. The time for performing step S21 is, for example, 1 second or longer and 10 seconds or shorter.

Next, the control unit 100 performs a purge step (step S23). Step S23 is performed from the timing t2 to a timing t3 illustrated in FIG. 12. In step S23, the purge gas is supplied into the processing container 11 while exhausting the inside of the processing container 11 by the exhaust device. As a result, the gas remaining inside the processing container 11 is replaced with the purge gas. The purge gas may be nitrogen gas, argon gas, other inert gases, or a combination thereof. The time for performing step S23 is, for example, 3 seconds or longer and 10 seconds or shorter. The purge gas may be supplied from, for example, the nitriding gas supply source 80.

Next, the control unit 100 performs a modification step for the Si-containing layer (step S25). Step S25 is performed from the timing t3 to a timing t4 illustrated in FIG. 12. In step S25, a modifying gas is supplied into the processing container 11 by the modifying gas supply source 75 while exhausting the inside of the processing container 11 by the exhaust device. Further, in step S25, a plasma ignition is performed in either the plasma box 19 or the processing container 11 to turn the modifying gas into plasma. In step S25, the ignition controlling method according to the embodiment is executed, and the control unit 100 controls the initial positions of the first and second variable capacitors 57 and 58 such that either the plasma box 19 or the processing container 11 is selected as the area where the plasma ignition is to be performed.

The modifying gas is, for example, nitrogen gas. The modifying gas may be hydrogen gas or ammonia gas. The modifying gas may be a gas containing nitrogen gas or a gas containing hydrogen gas. The Si-containing layer is modified with the modifying gas turned into plasma. The modification of the Si-containing layer includes, for example, removing a halogen element contained in the Si-containing layer. By removing the halogen element, dangling bonds of Si may be formed. As a result, the Si-containing layer may be activated, and the nitriding of the Si-containing layer may be accelerated. The frequency of the radio frequency of the RF power supply 55 is, for example, 13.56 MHz or 14.56 MHz. The time for performing step S25 is, for example, 3 seconds or longer and 60 seconds or shorter.

Next, the control unit 100 performs a purge step (step S27). Step S27 is performed from the timing t4 to a timing t5 illustrated in FIG. 12. In step S27, a purge gas is supplied into the processing container 11 while exhausting the inside of the processing container 11 by the exhaust device. As a result, the gas remaining inside the processing container 11 is replaced with the purge gas. The time for performing step S27 is, for example, 3 seconds or longer and 10 seconds or shorter. The purge gas may be, for example, nitrogen gas, and may be supplied from, for example, the nitriding gas supply source 80.

Next, the control unit 100 performs a nitriding step for the Si-containing layer (step S29). Step S29 is performed from the timing t5 to a timing t6 illustrated in FIG. 12. In step S29, a nitriding gas is supplied into the processing container 11 by the nitriding gas supply source 80 while exhausting the inside of the processing container 11 by the exhaust device. Further, in step S29, the plasma ignition is performed in either the plasma box 19 or the processing container 11 to turn the nitriding gas into plasma. In step S29, the ignition controlling method according to the embodiment is executed, and the control unit 100 controls the initial positions of the first and second variable capacitors 57 and 58 such that either the plasma box 19 or the processing container 11 is selected as the area where the plasma ignition is to be performed. The nitriding gas is, for example, ammonia gas. The Si-containing layer is nitrided with the ammonia gas turned into plasma. The time for performing step S29 is, for example, 5 seconds or longer and 120 seconds or shorter.

Next, the control unit 100 performs a purge step (step S31). Step S31 is performed from the timing t6 to a timing t7 illustrated in FIG. 12. In step S31, a purge gas is supplied into the processing container 11 while exhausting the inside of the processing container 11 by the exhaust device. As a result, the gas remaining inside the processing container 11 is replaced with the purge gas. The time for performing step S31 is, for example, 3 seconds or longer and 10 seconds or shorter. The purge gas may be, for example, nitrogen gas, and may be supplied from, for example, the nitriding gas supply source 80.

Next, the control unit 100 determines whether steps S21 to S31 have been repeated a set number of times (step S33). The set number of times is set in advance, and when the control unit 100 determines that the steps have not been repeated the set number of times, the process returns to step S21 to repeat the cycle of steps S21 to S31. During the repetition of the cycle, the temperature of the wafers 2 is, for example, 400° C. or higher and 600° C. or lower, and the atmospheric pressure in the processing container 11 is, for example, 13 Pa or more and 665 Pa or less.

When the controller 100 determines that the steps have been repeated the set number of times, the process is ended because a silicon nitride film having a desired film thickness and film quality has been formed.

In the film forming method described above, the purge step may be omitted. The film forming method according to the embodiment includes the following steps (a), (b), and (c):

(a) supplying a raw material gas containing an element to be nitride, to a substrate, thereby forming a layer containing the element on the substrate;

(b) supplying nitrogen gas, hydrogen gas, or ammonia gas activated by plasma after supplying the raw material gas to the substrate; and (c) supplying a gas containing nitrogen activated by plasma to nitride the element.

In step (b), an area where a plasma ignition is to be performed is selected from a plasma box and a processing container by using the ignition controlling method described above.

[Effects]

In prior art, plasma is generated in a quartz plasma box 19 disposed on the side surface of the processing container 11, and an activated gas is supplied into the processing container 11. Meanwhile, in the present embodiment, plasma may be generated in the processing chamber 11 by controlling the electrode-to-electrode voltage and the electrode-to-wafer voltage at the time of plasma ignition. Further, the plasma ignition may be alternately performed in the plasma box 19 and the processing container 11, or the plasma ignition may be performed in at least one of the plasma box 19 and the processing container 11. As a result, the controllability of the film thickness and the film quality of the silicon nitride film on the wafers may be improved.

The matching position at the time of plasma generation (ignition) may change due to, for example, the cumulative film thickness of the silicon nitride film on, for example, the wall surface of the processing container 11, the cleaning of the inside of the processing container 11, and the maintenance of the film forming apparatus 10. In this case, the initial positions of the variable capacitors and the frequency of the RF power supply 55 at the time of ignition may be corrected according to the amount of the change in matching position. By using the tables generated in advance and the changed matching position, the plasma ignition may be performed in the plasma box 19 or the processing container 11 in which the reflected wave is suppressed, even after the matching position changes.

As described above, according to the ignition controlling method, the film forming method, and the film forming apparatus of the embodiments of the present disclosure, the area where the plasma ignition is to be preformed may be selected from the plasma box and the processing container. As a result, the controllability of the film thickness and the film quality of the film formed on the wafers may be improved.

The ignition controlling method, the film forming method, and the film forming apparatus according to the embodiments disclosed herein are merely examples in all aspects, and should not be construed as being limited.

According to an aspect, the controllability of the film thickness and the film quality of a film formed on a substrate may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An ignition controlling method comprising:
  providing a film forming apparatus including:
    a processing container configured to accommodate a substrate;
    a plasma box formed on the processing container;
    a pair of electrodes arranged to sandwich the plasma box therebetween; and
    an RF power supply connected to the pair of electrodes via a matching box including a variable capacitor,
  detecting, in advance and in a state where no plasma discharge occurs in the plasma box and the processing container, a first voltage between the electrodes for each of a plurality of adjustment positions of the variable capacitor when a radio-frequency voltage with a first frequency is applied to the pair of electrodes from the RF power supply, and a second voltage between one of the electrodes and the substrate for each of the plurality of adjustment positions of the variable capacitor when the radio-frequency voltage with the first frequency is applied between the electrodes and the substrate from the RF power supply;
  identifying, based on the first and second voltages, a first adjustment position of the plurality of adjustment positions of the variable capacitor at which plasma ignition occurs in the plasma box and a second adjustment position of the plurality of adjustment positions of the variable capacitor at which plasma ignition occurs in the processing container;
  storing the first and second voltages and the first and second adjustment positions in a storage;
  determining an initial position of the variable capacitor based on the first and second voltages and the first and second adjustment positions, by referring to the storage; and selecting an area where a plasma ignition is to be performed from the plasma box and the processing container, by setting the adjustment positions of the variable capacitor to the initial position.

2. The ignition controlling method according to claim 1, wherein the detecting detects, in advance and in the state where no plasma discharge occurs in the plasma box and the processing container, a third voltage between the electrodes for each of the plurality of adjustment positions of the variable capacitor when a radio-frequency voltage with a second frequency different from the first frequency is applied to the electrodes, and a fourth voltage between one of the electrodes and the substrate for each of the plurality of adjustment positions of the variable capacitor when the radio-frequency voltage with the second frequency is applied between the electrodes and the substrate,
the identifying identifies, based on the third and fourth voltages, a third adjustment position of the plurality of adjustment positions of the variable capacitor at which plasma ignition occurs in the plasma box and a fourth adjustment position of the plurality of adjustment positions of the variable capacitor at which plasma ignition occurs in the processing container;
the storing stores the third and fourth voltages and the third and fourth adjustment positions in the storage;
wherein the RF power supply is configured to variably control a frequency, and the ignition controlling method further comprising:
controlling the frequency of the RF power supply to the second frequency,
wherein in the determining, when the frequency of the RF power supply is controlled to the second frequency, the initial position of the variable capacitor is updated based on the third and fourth voltages and the third and fourth adjustment positions, by referring to the storage, and
wherein in the selecting, the area where the plasma ignition is to be performed is selected from the plasma box and the processing container, by setting the adjustment positions of the variable capacitor to the updated initial position.

3. The ignition controlling method according to claim 2, wherein in the determining, the initial position of the variable capacitor is further updated based on the first and second adjustment positions.

4. A film forming method comprising:
(a) supplying a raw material gas containing an element to be nitrided, to a substrate, thereby forming a layer containing the element on the substrate;
(b) after supplying the raw material gas to the substrate, supplying nitrogen gas, hydrogen gas, or ammonia gas activated by plasma to modify the layer containing the element; and
(c) supplying a gas containing nitrogen activated by plasma to nitride the element,
wherein in (b), an area where a plasma ignition is to be performed is selected from a plasma box and a processing container by using the ignition controlling method according to claim 1.

5. The ignition controlling method according to claim 1, wherein the first adjustment position and the second adjustment position are positions where a reflected wave at the time of plasma ignition is suppressed.

6. The ignition controlling method according to claim 1, wherein the first adjustment position is identified when the first voltage is equal to or higher than a first discharge voltage for plasma ignition in the plasma box, and
the second adjustment position is identified when the first voltage is less than the first discharge voltage for plasma ignition in the plasma box, and the second voltage is equal to or higher than a second discharge voltage for plasma ignition in the processing container.

7. A film forming apparatus comprising:
a processing container configured to accommodate a substrate;
a plasma box formed on the processing container;
a pair of electrodes arranged to sandwich the plasma box therebetween;
an RF power supply connected to the pair of electrodes via a matching box including a variable capacitor; and
a controller,
wherein the controller is configured to cause:
detecting, in advance and in a state where no plasma discharge occurs in the plasma box and the processing container, a first voltage between the electrodes for each of a plurality of adjustment positions of the variable capacitor when a radio-frequency voltage with a first frequency is applied to the pair of electrodes from the RF power supply, and a second voltage between one of the electrodes and the substrate for each of the plurality of adjustment positions of the variable capacitor when the radio-frequency voltage with the first frequency is applied between the electrodes and the substrate from the RF power supply;
identifying, based on the first and second voltages, a first adjustment position of the plurality of adjustment positions of the variable capacitor at which plasma ignition occurs in the plasma box and a second adjustment position of the plurality of adjustment positions of the variable capacitor at which plasma ignition occurs in the processing container;
storing the first and second voltages and the first and second adjustment positions in a storage;
determining an initial position of the variable capacitor based on the first and second voltages and the first and second adjustment positions, by referring to the storage; and
selecting an area where a plasma ignition is to be performed from the plasma box and the processing container, by setting the adjustment positions of the variable capacitor to the initial position.

* * * * *